United States Patent [19]
Fujimoto et al.

[11] Patent Number: 5,824,575
[45] Date of Patent: Oct. 20, 1998

[54] SEMICONDUCTOR DEVICE AND METHOD OF MANUFACTURING THE SAME

[75] Inventors: Hiromasa Fujimoto; Hiroyuki Masato, both of Osaka; Yorito Ota, Hyogo; Tomoya Uda, Kyoto, all of Japan

[73] Assignee: Matsushita Electric Industrial Co., Ltd., Osaka, Japan

[21] Appl. No.: 517,854

[22] Filed: Aug. 22, 1995

[30] Foreign Application Priority Data

Aug. 22, 1994 [JP] Japan .................................. 6-196606
Mar. 23, 1995 [JP] Japan .................................. 7-063971

[51] Int. Cl.$^6$ ................................................. H01L 21/338
[52] U.S. Cl. ........................... 438/174; 438/181; 438/602
[58] Field of Search .................................. 438/174, 181, 438/185, 518, 519, 521, 718, 734, 602

[56] References Cited

U.S. PATENT DOCUMENTS

| | | | |
|---|---|---|---|
| 4,668,335 | 5/1987 | Mockler et al. | 438/734 |
| 4,694,564 | 9/1987 | Enoki et al. | 438/183 |
| 5,143,856 | 9/1992 | Iwasaki | 438/522 |
| 5,453,403 | 9/1995 | Meng et al. | 438/734 |
| 5,496,779 | 3/1996 | Lee et al. | 438/182 |

FOREIGN PATENT DOCUMENTS

| | | | |
|---|---|---|---|
| 59-213172 | 12/1984 | Japan | 438/423 |
| 60-254667 | 12/1985 | Japan | 438/423 |
| 1-56539 | 11/1989 | Japan . | |
| 3-55852 | 3/1991 | Japan . | |
| 6-77255 | 3/1994 | Japan | 438/423 |

*Primary Examiner*—Michael Trinh
*Attorney, Agent, or Firm*—McDermott, Will & Emery

[57] ABSTRACT

After forming an n-type active layer, an $n^+$-type source region and an $n^+$-type drain region at predetermined regions of a GaAs substrate, a silicon oxide film and a silicon nitride film are deposited, and then source and drain electrodes are formed. By effecting overetching on the silicon nitride film using a resist mask formed on the silicon nitride film, an upper layer portion of the silicon oxide film at a gate electrode formation region is removed, and a carrier concentration at the active layer immediately under the gate electrode is reduced. This improves a gate/drain breakdown voltage. Thereafter, a lower layer portion of the silicon oxide film at the gate formation region is removed by wet etching, and the gate electrode is formed at this removed region. A drain breakdown voltage is improved owing to reduction of the carrier concentration only at the surface region of the active layer immediately under the gate electrode.

11 Claims, 36 Drawing Sheets

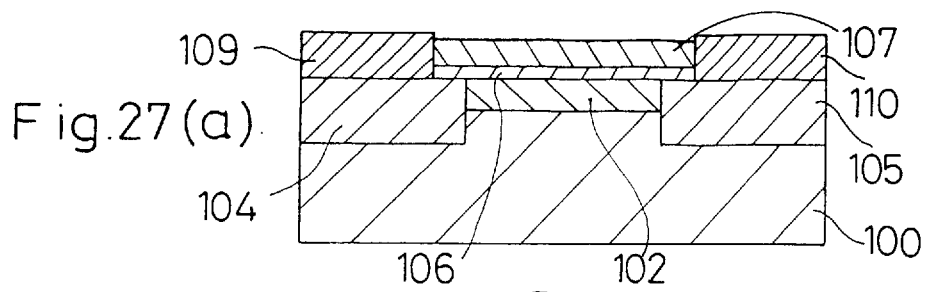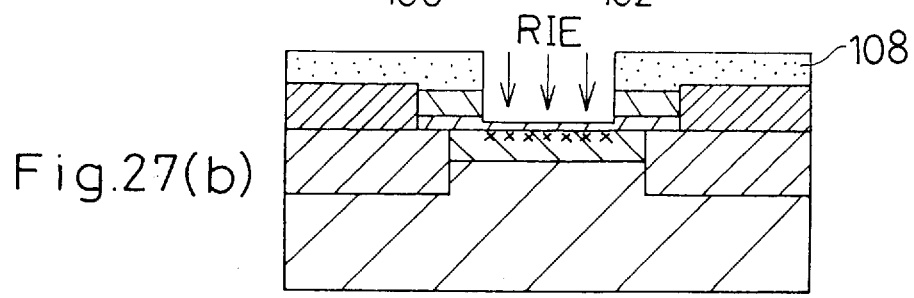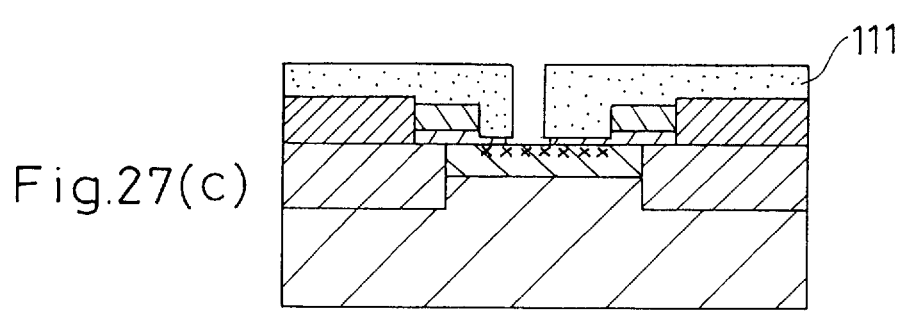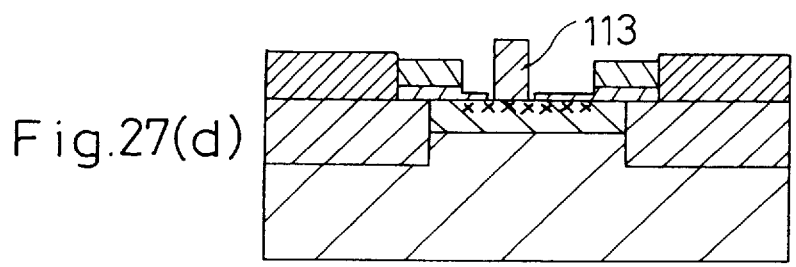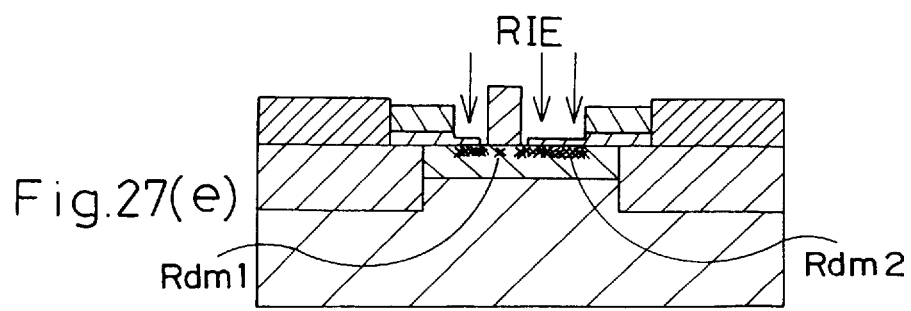

SEMICONDUCTOR DEVICE AND METHOD OF MANUFACTURING THE SAME

BACKGROUND OF THE INVENTION

1. Field of the Invention

The present invention relates to a semiconductor device using a compound semiconductor and a method of manufacturing the same.

2. Description of the Background Art

In recent years, a demand for a metal semiconductor field-effect transistor (which will be referred to as an MESFET) formed on a compound semiconductor substrate such as a GaAs substrate having a semi-insulating property has been rapidly increased for using it as a transmission device such as a mobile communication equipment because it can be a power device allowing a high gain and a high efficiency. In a method of manufacturing the MESFET, two processes, i.e., a process using an epitaxial growth method and a process using an ion implantation method can be generally selected for forming an active layer.

FIGS. 32 and 33 shows steps in a convention process of manufacturing an MESFET using a selective ion implantation method ("Ultra-High Speed Compound Semiconductor Device" compiled by Takuo Sugano and supervised by Masamichi Omori, Baifukan, p. 75).

As shown at (a) in FIG. 32, after depositing a silicon nitride film 201 on a semi-insulating substrate 200 made of GaAs, a first resist mask 202 is formed on the silicon nitride film 201. Then, Si (silicon) ions are implanted using the first resist mask 202 to form an n-type region 203 forming a channel region on the semi-insulating substrate 200.

As shown at (b) in FIG. 32, Si ions are then implanted using a second resist mask 204 formed on the silicon nitride film 201 to form $n^+$-regions 205 forming source/drain regions on the semi-insulating substrate 200.

As shown at (c) in FIG. 32, after forming an insulating film 206 on the silicon nitride film 201, annealing is effected on the n-region 203 and $n^+$-regions 205 using the silicon nitride film 201 and insulating film 206 as a protection film.

As shown at (a) in FIG. 33, openings located above the $n^+$regions 205 are formed at the silicon nitride film 201 and the insulating film 206, and ohmic electrodes 207 connected to the $n^+$-regions 205 are formed in the opening.

As shown at (b) in FIG. 33, an opening located above the n-region 203 is formed at the silicon nitride film 201 and insulating film 206. Then a gate electrode 208 is formed in this opening, and first layers, i.e., first metal interconnections 209 are formed on the ohmic electrodes 207.

As shown at (c) in FIG. 33, after depositing an interlayer insulating film 210, second metal interconnections 211 electrically connected to the first layers, i.e., metal interconnections 209 are formed.

In order to improve the high-frequency property and efficiency of the power MESFET handling large signals, it is necessary to improve the properties of the MESFET such as a transmission conductance gm and a k-value, and for this purpose, it is necessary to provide an active layer which is heavily doped and has a reduced thickness.

In the power MESFET, however, it is necessary not only to improve the properties of the MESFET but also to maintain a high gate/drain breakdown voltage. However, there is a tradeoff relationship between the gate/drain breakdown voltage and the properties of MESFET, i.e., the transmission conductance gm and k-value.

In order to improve the gate/drain breakdown voltage, therefore, such a structure (which will be referred to as a recess structure) has been used that a portion of an active layer 221 formed on a semi-insulating substrate 220 located immediately under a gate electrode 222 is etched and removed as shown in FIG. 34. In FIG. 34, 223 indicates an insulating layer, 224 indicates a source electrode, 225 indicates a drain electrode and 226 indicates a recessed space. In order to improve the gate/drain breakdown voltage, such an asymmetric structure is often employed that a distance between the gate electrode 222 and the drain electrode 225 is larger than a distance between the gate electrode 222 and the source electrode 224 as shown in FIG. 34.

Further, it has also been known that an MESFET of a self-alignment type utilizing the conventional ion implantation employs an LDD structure shown in FIG. 35 for reduction of sizes and improvement of the breakdown voltage. In the process of manufacturing the MESFET shown in FIG. 35, after an active layer 233 is formed at a predetermined region of a semi-insulating GaAs substrate 230, a WSi film is formed by depositing WSi, which is high-melting point metal, entirely on the semi-insulating GaAs substrate 230, and then is patterned to form a gate electrode 236. Using the gate electrode 236 as a mask, ion-implantation of impurity at a low concentration is carried out to form $n^-$-regions 241 and 242, which will form lightly doped source and drains, and then photolithography is employed to carry out ion-implantation of impurity at a high concentration into the outer sides of them to form $n^+$-regions (heavily doped layers) 238 and 239 which will form the source/drain. After deposition of an SiN film 243, openings are formed at portions of the SiN film 243 located immediately above the $n^+$-regions 238 and 239. Ohmic electrodes 244 and 245 made of AuGe.Ni.Au are formed in these openings. In the MESFET shown in FIG. 35, the $n^-$-regions 241 and 242 functioning as the lightly doped source/drain are formed between the $n^+$-regions 238 and 239 and the active layer 233, i.e., channel region, respectively, and the $n^-$-region 241 near the source has a width smaller than the $n^-$-region 242 near the drain. Thus, the FET shown in FIG. 35 has a laterally asymmetric structure similarly to the FET shown in FIG. 34. The distance between the $n^+$-region 238 near the source and the gate electrode 236 is reduced for reducing the source resistance, and the distance between the $n^+$-region 239 near the drain and the gate electrode 236 is increased for improving the gate/drain breakdown voltage.

Meanwhile, in the field of information communication, there is a tendency that the frequency of signals increases due to digitization of the mobile communication and increase of the information quantity, and in particular, such circuitry is being developed that handles signals of millimeter waveband (30–300 GHz) which are expected to be applied to automobile collision-avoidance system, LAN and others. For this reason, devices allowing operation at a higher frequency have been demanded, and the FETs have been developed to improve the performance of device with respect to the high-frequency signals by providing an MESFET using the GaAs substrate in which the active layer is formed by epitaxial growth instead of the conventional ion implantation as well as a heterojunction FET (HFET) such as an HEMT. As one of indexes for evaluating the performance of the device for high-frequency signal, there is a maximum oscillation frequency (fmax). It is generally necessary that the maximum oscillation frequency fmax is three times as large as the used frequency. In a system using a band of, e.g., 70 GHz, the maximum oscillation frequency fmax of the device must be 200 GHz or more. The maximum oscillation frequency fmax of FET can be expressed by the following formula (1) (M. B. Das, IEEE Trans. Electron Device vol ED-32 No.1, pp.11–17, January 1985).

$$f\max = \frac{f_T}{\sqrt{4 \cdot \frac{gd}{gm}\left(gm \cdot Ri + \frac{Rs+Rg}{1/gm+Rs}\right) + \frac{4}{5} \cdot \frac{Cgd}{Cgs} \cdot \left(1 + \frac{2.5Cgd}{Cgs}\right)(1+GmRs)^2}}$$ [Formula 1]

where $$f_T = \omega T/2\pi = gm/2\pi Cgs \quad (2)$$

fT: maximum cut-off frequency
f: frequency
Rs: source resistance
Ri: channel resistance
Rg: gate resistance
Cgs: gate/source capacity
Cgd: gate/drain capacity
gm: mutual conductance
gd: drain conductance Therefore, in order to improve the maximum oscillation frequency fmax and maximum cut-off frequency fT and thereby improve the high-frequency property, it is necessary to reduce the values of respective parameters Rs, Ri, Cgd, Cgs and gd and thereby improve the mutual conductance gm.

Now, description will be given on the GaAs MESFET for millimeter wave using an epitaxial substrate with reference to FIG. 36.

FIG. 36 is a cross section of a GaAs MESFET for millimeter wave using a conventional epitaxial substrate. There are provided a semi-insulating GaAs substrate 300, a buffer layer 301 made of undoped GaAs, a channel layer 302 made of n-type GaAs, contact layers 304a and 304b for ohmic contact made of $n^+$-GaAs, a source electrode 309, a drain electrode 310, a gate electrode 313 and an isolating region 320. A minimum gate length Lg is about 0.1 μm or more, a thickness of each of the contact layers 304a and 304b is about 50 nm, and a gap Gp between the gate electrode 313 and each of the contact layers 304a and 304b is generally 50 nm or less.

Description will now be given on the operation of the GaAs MESFET thus constructed. During operation of the GaAs MESFET, a current flows from the source electrode 309 toward the drain electrode 310. In connection with this current, the voltage of the gate electrode 313 is changed to change a width of a depletion layer of a Schottky barrier and thereby control the channel width for performing a three-terminal operation. In accordance increase of the voltage applied to the drain electrode 310, the width of the depletion layer under the gate electrode 313 increases until the depletion layer reaches the contact layers 304a and 304b. Accordingly, the gate/drain capacity Cgd decreases, and the maximum oscillation frequency fmax increases as can be seen from the formula (1). The device which can handle the signals of millimeter wave are constructed using the above phenomenon.

However, the following problems arise in the MESFET formed on the conventional compound semiconductor substrate.

First, only the recess structure shown in FIG. 34 or the structure including asymmetric source/drain shown in FIG. 35 can improve the gate/drain breakdown voltage only to a limited extent.

Second, it is known that, in the MESFET using a compound semiconductor substrate such as a GaAs substrate, a stress applied to the gate electrode causes piezoelectric charges, resulting in variation in the threshold voltage, so that it is impossible to expect sufficient improvement in the property of MESFET and the yield thereof.

Third, in the high-frequency FET such as the GaAs MESFET for millimeter wave, the following problem arises due to a short distance between the gate electrode and the contact layers at the opposite sides. Although the depletion layer under the gate electrode expands in accordance with the drain voltage, the value of the maximum oscillation frequency fmax will no longer increase after the depletion layer is brought into contact with the contact layer. The drain conductance increases due to concentration of the electric field at an edge of the contact layer, which causes reduction of the maximum oscillation frequency fmax. Further, the breakdown voltages between the gate and source and between the gate and drain decrease, and thus the operation region is narrowed, so that sufficiently large signals cannot be handled in a device for amplifying a power. Meanwhile, it is impossible to increase the distance between the gate electrode and the contact layer due to the following reason. In the process of producing the FET, wet recess etching is generally carried out to remove a region Rgp of the contact layer shown in FIG. 36, which includes a portion for forming the gate electrode and portions located at opposite sides thereof, for forming the Schottky barrier and controlling the threshold voltage. In this step, the lateral length of the removed portion depends on the thickness of the contact layer and the vertical length of the removed portion, i.e., setting of the threshold voltage and others, so that the distance between the gate electrode and the contact layers at the opposite sides thereof can be increased only to a limited extent.

Although the lateral length of the removed portion depends on the type of etching liquid and the etching conditions, the high-frequency FET has an extremely small gate length of about 0.2 μm (i.e., subquarter micron gate), so that the opening functions as an extremely small opening in the recess etching. Therefore, the etching liquid cannot sufficiently flow, and it is difficult to control the lateral length of the removed portion, so that the drain breakdown voltage may be impaired due to variation in the conditions for the manufacturing process.

SUMMARY OF THE INVENTION

A first object of the invention is to provide a method of manufacturing an FET, which adopts measures for improving a gate/drain breakdown voltage without reducing properties of the FET and thereby allows easy manufacturing of a high-performance FET with a good yield.

A second object of the invention is to provide a method of manufacturing a semiconductor device, which adopts measures for forming a steep carrier profile at the vicinity of a surface of a compound semiconductor substrate, and thereby can form the semiconductor device of a high performance by utilizing this carrier profile.

The third object of the invention is to provide an FET to be mounted on a compound semiconductor substrate, and specifically an FET having a high transmission conductance gm and a high k-value as well as a high gate/drain breakdown voltage.

A fourth object of the invention is to improve a high-frequency property of a high-frequency FET by adopting measures for reducing a gate/drain capacity Cgd without causing a disadvantage in a manufacturing process.

In order to achieve the first object, a first method of manufacturing a semiconductor device of the invention for forming the semiconductor device functioning as an FET at a portion of a compound semiconductor substrate includes the steps of forming an active layer of a first conductivity type at a portion of the compound semiconductor substrate, the active layer having a carrier concentration required for operation of the FET and forming a channel region of the FET; forming a low carrier concentration layer at a portion including at least a portion of a surface region of the active layer by reducing the carrier concentration at the portion including at least the portion of the surface region of the active layer; forming a gate electrode of the FET at a portion including at least a portion of the low carrier concentration layer; and forming source/drain regions of the FET connected to the active layer by introducing impurity into portions of the compound semiconductor substrate at opposite sides of the gate electrode.

According to the above method, at the step of forming the low carrier concentration layer, the low carrier concentration layer is formed only at the surface region of the formed active layer located immediately under the gate electrode. A portion of the active layer other than the low carrier concentration layer functions as the channel region. Therefore, it is possible to improve the gate/drain breakdown voltage of the FET while maintaining the high transmission conductance gm and the high k-value by forming the active layer of a high concentration and a small thickness. Since the channel region is isolated from the gate electrode by the low carrier concentration layer, it is possible to suppress generation of piezoelectric charges at the channel region.

According to the first method of manufacturing the semiconductor device, the step of forming the low carrier concentration layer may include the step of implanting second impurity ions for increasing an electrical resistance into a region for forming the low carrier concentration layer to form the low carrier concentration layer made of a high resistance layer.

According to this method, the step of forming the low carrier concentration layer forms the high resistance layer at the region immediately under the gate electrode. Thus, the portion of the FET immediately under the gate electrode forms the high resistance layer, so that the gate/drain breakdown voltage is particularly improved.

According to the first method of manufacturing the semiconductor device, the step of forming the low carrier concentration layer may include the step of implanting impurity ions into a region for forming the low carrier concentration layer to form the low carrier concentration layer made of an impurity diffusion layer of a second conductivity type.

In the step of forming the low carrier concentration layer according to this method, the region immediately under the gate electrode forms the impurity diffusion layer containing diffused impurity of a conductivity type opposite to that of the active layer functioning as the channel region under the same. Therefore, the FET forms a pn-junction gate FET (JFET) including the impurity diffusion layers each formed in a self-aligned manner with respect to the gate electrodes, so that the pn-junction gate FET having a high transmission conductance gm and a high k-value as well as a high uniformity can be formed easily. Since the low carrier concentration layer contains a large amount of electric charges of a type opposite to the carrier in the channel region, generation of the piezoelectric charges can be effectively suppressed.

In the case where the high resistance layer is formed as the lower carrier concentration layer in the first method of manufacturing the semiconductor device, the step of forming the low carrier concentration layer made of the high resistance layer may include the step of forming the high resistance layer at the surface region of the active layer containing portions at the opposite sides of the gate electrode, and the method may further include the steps of implanting impurity ions into a portion of the high resistance layer located immediately under the gate electrode, and thereby forming the impurity diffusion region of the second conductivity type shallower than the high resistance layer.

In the step of forming the low carrier concentration layer according to this method, the regions located under the gate electrode and at the opposite sides thereof form the high resistance layer, and in the subsequent step of forming the impurity diffusion region, the impurity diffusion layer of the conductivity type opposite to that of the channel region is formed at the region located immediately under the gate electrode and surrounded by the high resistance layer. Thus, the FET is provided at the position under the gate electrode with the channel region, the high resistance layer above the same and the impurity diffusion layer having the conductivity type opposite to the channel region and located above the high resistance layer, so that the invention can provide the pin-junction gate FET having a high transmission conductance gm and a high k-value. Since it is possible to change freely a depth and a width of the high resistance layer, the pin-junction gate FET can be designed with an enlarged degree of freedom.

In the case where the high resistance layer is formed as the lower carrier concentration layer in the first method of manufacturing the semiconductor device, the step of forming the low carrier concentration layer made of the high resistance layer may include the step of forming the high resistance layer at the surface region of the active layer containing portions at the opposite sides of the gate electrode, and the method may further include the steps of implanting impurity ions into a portion of the high resistance layer located immediately under the gate electrode, and thereby forming an impurity diffusion region of the first conductivity type shallower than the high resistance layer.

In the step of forming the low carrier concentration layer according to this method, the regions located under the gate electrode and at the opposite sides thereof form the high resistance layer, and in the subsequent step of forming the impurity diffusion region, the impurity diffusion layer of the same conductivity type as that of the channel region is formed at the region located immediately under the gate electrode and surrounded by the high resistance layer. Thus, there is provided at the position under the gate electrode with the channel region, the high resistance layer above the same and the impurity diffusion layer having the same conductivity type as the channel region and located above the high resistance layer. In this case, by increasing the width of the high resistance layer and reducing the depth thereof, it is possible to improve the drive power while maintaining a high breakdown voltage by suppressing lateral movement of carriers. Properties of the FET can be changed by adjusting the depths and widths of the high resistance layer and the impurity diffusion region, which increases the degree of freedom in design of the FET.

In the case where the low carrier concentration layer made of the high resistance layer or the impurity diffusion layer of the second conductivity type is formed, the first method of manufacturing the semiconductor device may further include the step of depositing on the compound semiconductor substrate a film having a function of reducing by a predetermined rate an implantation energy of the impurity ions prior to the step of forming the active layer, so that the impurity ions are implanted into the compound semiconductor substrate through the above film in the step of forming the active layer.

In the above case, it is preferably that a metal film for forming the gate electrode of the FET is deposited as the above film in the step of depositing the above film.

According to these methods, a steep carrier profile is formed at the active layer under the gate electrode, so that the FET can have a particularly high transmission conductance gm and a particularly high k-value.

In the first method of manufacturing the semiconductor device, the step of forming the low carrier concentration layer may include the steps of depositing a first insulating film on the active layer; depositing a second insulating film on the first insulating film; forming a first resist mask located on the second insulating film and having an opening located at a region including at least a gate electrode formation region; removing the second insulating film and an upper layer portion of the first insulating film at the gate electrode formation region by effecting overetching on the second insulating film using the first resist mask and etching agent allowing etching of the second insulating film at an etching rate larger than that of the first insulating film; and removing a lower layer portion of the first insulating film at the gate electrode formation region by effecting etching on the first insulating film with a second resist mask provided with an opening at a portion including at least the gate formation region; so that the overetching effected on the second insulating film can form the low carrier concentration layer made of a damage layer at a surface region of the active layer located at the opening of the first resist mask.

According to this method, the overetching, which is effected on the second insulating film at the upper level using the resist mask having the opening at the gate electrode formation region, etches the upper layer portion of the first insulating film at the lower level, and affects the portion of the active layer immediately under the gate electrode to reduce the carrier concentration, so that the low carrier concentration layer is formed. Therefore, generation of the piezoelectric charges is suppressed, and the gate/drain breakdown voltage of the FET is improved.

In the case of forming the low carrier concentration layer made of the damage layer, the first method of manufacturing the semiconductor device may include, between the step of forming the first insulating film and the step of forming the second insulating film, the step of annealing the active layer for activating the active layer using the first insulating film as a protection film, and the first insulating film may be used as a protection film of the FET formed on the compound semiconductor substrate.

According to this method, since the first insulating film is used as the protection film for the annealing, and is also used as the protection film at the lowest level of the FET, so that the manufacturing process can be simplified.

In the case of forming the low carrier concentration layer made of the damage layer according to the first method of manufacturing the semiconductor device, the overetching at the step of removing the upper layer portion of the first insulating film may be dry etching, and the etching at the step of removing the lower layer portion of the first insulating film may be wet etching.

According to this method, since the overetching effected on the first insulating film is the dry etching, the influence by the overetching can be surely applied to the portion of the active layer immediately under the gate electrode. Since the etching effected on the second insulating film is the wet etching, the lower layer portion of the second insulating film can be removed without damaging the active layer.

In the case of forming the low carrier concentration layer made of the damage layer according to the first method of manufacturing the semiconductor device, the first insulating film may be a silicon oxide film and the second insulating film may be a silicon nitride film.

According to this method, since the first insulating film is the silicon oxide film and the second insulating film is the silicon nitride film, the etching agent of which etching rate with respect to the second insulating film is larger than that with respect to the first insulating film can be selected without difficulty.

In the first method of manufacturing the semiconductor device, ions may be selectively implanted into a predetermined portion on the compound semiconductor substrate at the step of forming the active layer, and the step of forming the low carrier concentration layer may include the steps of depositing an insulating film on the active layer; forming a first resist film having an opening at a region including at least a gate electrode formation region on the insulating film; removing an upper layer portion of the insulating film at the gate electrode formation region by effecting dry etching on the insulating film using the first resist mask to an extent reducing a carrier concentration near the surface of the active layer; and removing a lower layer portion of the insulating film at the gate electrode formation region by effecting wet etching on the insulating film using a second resist mask.

According to this method, since the upper layer portion of the insulating film at the gate electrode formation region is removed by effecting the dry etching on the insulating film to an extent reducing the carrier concentration at the active layer, the carrier concentration at the portion of the active layer immediately under the gate electrode can be reduced, which improves the gate/drain breakdown voltage and suppresses generation of piezoelectric charges. Since the wet etching is effected on the insulating film to remove the lower layer portion of the insulating film at the gate electrode formation region, the lower layer portion of the second insulating film can be removed without damaging the active layer.

In the case of forming the low carrier concentration layer made of the damage layer according to the first method of manufacturing the semiconductor device, the step of forming the first resist mask may be carried out such that the opening at the first resist mask is wider than the gate electrode formation region, and the step of forming the second resist mask may be carried out such that the second resist mask has the opening at a region offset toward the source region.

In this case, the step of forming the second resist mask may be carried out such that the second resist mask has the opening at a region offset toward the source to include an end near the source region of the opening formed at the step of removing the second insulating film and the upper layer portion of the first insulating film, and the step of forming the gate electrode may be carried out such that a metal film forming the gate electrode is deposited from an upper side of the second resist mask, and subsequently the second resist mask is lifted off while leaving the gate electrode.

This method allows easy formation of the FET having the gate electrode offset toward the source electrode. The FET thus formed has a high drain breakdown voltage and a small source resistance. This serves together with improvement of the drain breakdown voltage by the low carrier concentration layer to achieve an extremely high drain breakdown voltage. In particular, by forming the gate electrode in a self-aligned manner with respect to the end of the active layer, the above effect becomes remarkable.

The method may further include the step, after the step of forming the gate electrode, of effecting dry etching to reduce further the carrier concentration at the surface region of the active region except for the damage region while leaving a lower portion of the lower layer portion of the first insulating film, and thereby forming a second damage layer.

According to this method, the second damage layer is formed at an upper portion of the active layer between the gate electrode and the drain electrode. Therefore, an electric field at the surface of the active layer of the FET thus formed is weakened, so that the drain breakdown voltage can be significantly improved without impairing the properties of the FET.

In order to achieve the second object described before, a second method of manufacturing the semiconductor device includes the steps of depositing on the compound semiconductor substrate a film having a function of reducing by a predetermined rate an implantation energy of impurity ions, and implanting the impurity ions into the compound semiconductor substrate through the above film.

In the second method of manufacturing the semiconductor device, it is preferable that the above film is a metal film for forming a gate electrode of the semiconductor device, in which case the step of implanting the impurity ions may form an active layer of a first conductivity type on a surface region of the compound semiconductor substrate.

According to the above methods, through-implantation of implanting the impurity ions through the film provides a steep impurity profile near the surface of the compound semiconductor substrate, and a device such as an FET of a high performance can be formed utilizing the steep profile.

The second method of manufacturing the semiconductor device may further include the steps of implanting impurity ions into at least a portion of the surface region of the active layer to form a high resistance layer at a portion including at least a portion of the surface region of the active layer; and forming the electrode of the semiconductor device on at least a portion of the high resistance layer.

According to this method, since a portion immediately under the electrode forms the high resistance layer, a device such as an FET particularly having a high gate/drain breakdown voltage can be formed.

The second method of manufacturing the semiconductor device may include the steps of implanting impurity ions into at least a portion of the surface region of the active layer to form an impurity diffusion region of a second conductivity type at a portion including at least the surface region of the active layer; and forming the electrode of the semiconductor device on at least a portion of the high resistance layer.

Since this method forms a pn-junction under the electrode, the method can provide a high-performance device such as a pn-junction gate FET utilizing the above pn-junction.

According to the second method of manufacturing the semiconductor device, the high resistance layer may be formed at the surface region of the active layer containing portions at the opposite sides of the gate electrode at the step of forming the high resistance layer, and the method may further include the step of implanting impurity ions into a portion of the high resistance layer located immediately under the gate electrode, and thereby forming an impurity diffusion region of the second conductivity type shallower than the high resistance layer.

According to this method, since there are disposed under the electrode a pin-junction formed of the active layer, the high resistance layer located thereon and the impurity diffusion region located on the high resistance layer and having the conductivity type opposite to that of the active layer, this method can provide a high performance device such as a pin-junction gate FET allowing design with a large degree of freedom by utilizing this pin-junction.

According to the second method of manufacturing the semiconductor device, the high resistance layer may be formed at the surface region of the active layer containing portions at the opposite sides of the gate electrode at the step of forming the high resistance layer; and the method may further include the step of implanting impurity ions into a portion of the high resistance layer located immediately under the gate electrode, and thereby forming an impurity diffusion region of the first conductivity type shallower than the high resistance layer.

According to this method, since there are disposed under the electrode the active layer, the high resistance layer located thereon and the impurity diffusion region located on the high resistance layer and having the same conductivity type as the active layer, this method can provide a device such as an FET having a large drive power and allowing design with a large degree of freedom by adjusting the depths and widths of the high resistance layer and impurity diffusion region.

In order to achieve the third object described above, the invention provides a first semiconductor device for being mounted on a compound semiconductor substrate and functioning as an FET, includes an active layer of a first conductivity type functioning as a channel region and formed by introducing carriers at a concentration required for operation of the FET into a portion of the compound semiconductor substrate; a low carrier concentration layer formed at a portion including at least a portion of a surface region of the active layer and having a carrier concentration lower than that of the active layer; a gate electrode formed on at least a portion of the low carrier concentration layer; and source/drain regions of the first conductivity type formed by introducing impurity at a high concentration into regions of the compound semiconductor substrate located at opposite sides of the gate electrode.

According to the above structure, the active layer formed under the gate electrode of the FET functions as the channel region during the operation of the FET. Since the low carrier concentration layer is formed between the channel region and the gate electrode, it is possible to form the active layer at a high concentration and a small thickness and thereby improve a gate/drain breakdown voltage BVgd of the FET while maintaining a high transmission conductance gm and a high k-value.

In the first semiconductor device, the low carrier concentration layer may form a high resistance layer.

According to this structure, since a portion immediately under the gate electrode of the FET forms the high resistance layer, the gate/drain breakdown voltage is particularly improved.

In the first semiconductor device, the low carrier concentration layer may form an impurity diffusion layer of the second conductivity type.

According to this structure, the low carrier concentration layer forms the impurity diffusion layer containing diffused impurity of a conductivity type opposite to that of the channel region located under the same. This results in a structure in which the respective impurity diffusion regions are formed in a self-aligned manner with respect to the gate electrodes, so that the invention can provide a pn-junction gate FET having a high transmission conductance gm and a high k-value as well as a high uniformity.

In the first semiconductor device, the high resistance layer may be formed at a region including portions of the active layer at the opposite sides of the gate electrode, and an impurity diffusion region of a second conductivity type shallower than the high resistance layer may be formed immediately under the gate electrode.

According to this structure, the active layer forming the channel region, the high resistance layer located thereon, and the impurity diffusion region having the conductivity type opposite to that of the channel region and located on the high resistance layer are disposed under the gate electrode, so that a pin-junction gate FET having a high transmission conductance gm and a high k-value can be obtained. In this case, since the depth and width of the high resistance layer can be freely determined, the pin-junction gate FET can be designed with an increased degree of freedom.

In the first semiconductor device, the high resistance layer may be formed at a surface region including portions of the active layer at opposite sides of the gate electrode, and an impurity diffusion region of the first conductivity type shallower than the high resistance layer may be formed immediately under the gate electrode.

According to this structure, the active layer forming the channel region, the high resistance layer located thereon and the impurity diffusion region having the same conductivity type as the channel region and located on the high resistance layer are disposed under the gate electrode. Therefore, the FET having a large drive power and allowing a high degree of freedom in design can be formed by adjusting the depths and widths of the high resistance layer and the impurity diffusion region.

Respective portions of the semiconductor device may preferably have the following sizes and impurity concentrations. The carrier concentration of the active layer is preferably from $1 \times 10^{17}$ to $3 \times 10^{17}$ cm$^{-3}$. The carrier concentration of the low carrier concentration layer is preferably not higher than $1 \times 10^{16}$ cm$^{-3}$. Furthermore, the carrier concentration of the low carrier concentration layer is more preferably from $5.0 \times 10^{14}$ to $5.0 \times 10^{15}$ cm$^{-3}$. In the active layer, the thickness of the channel region except for the low carrier concentration layer is preferably from 80 to 150 nm, and the depth of the low carrier concentration layer is preferably from 20 to 50 nm.

It is preferable to increase the thickness of the channel region in the active layer except for the low carrier concentration layer in accordance with increase of a power supply voltage applied to the drain region.

In the first semiconductor device, the low carrier concentration layer may be formed at a region in the active layer larger than a region immediately under the gate electrode, and the low carrier concentration layer may be formed of a first low carrier concentration layer formed immediately under the gate electrode and a second low carrier concentration layer formed at the region other than the region immediately under the gate electrode.

This structure suppresses an electric field at the surface of the active layer and across the gate and drain, and hence the drain breakdown voltage can be significantly improved while maintaining a sufficient high-frequency property.

In order to achieve the fourth object, the invention provides a third method of manufacturing a semiconductor device, wherein the semiconductor device functioning as an FET is formed at a portion of a compound semiconductor substrate, including the steps of forming an active layer of a first conductivity type at a portion of the compound semiconductor substrate, the active layer forming a channel region of the FET; forming a semiconductor layer of a low resistance on the active layer; forming a source electrode and a drain electrode spaced on the semiconductor layer with a predetermined distance between each other; performing processing on a region of the semiconductor layer between the source electrode and the drain electrode using a mask having an opening located over a region of a width larger by a predetermined value than at least a gate length, and thereby giving selectively an insulating property to a portion of the semiconductor layer located in the opening of the mask and having at least a fraction of an entire thickness of the semiconductor layer; removing a portion of the semiconductor layer located in the opening of the mask at the preceding step to expose a surface of the active layer under the semiconductor layer; and forming a gate electrode at the region from which the portion provided with the insulating property is removed.

In the third method of manufacturing the semiconductor device, the step of giving the insulating property to a portion of the semiconductor layer may be carried out either by plasma irradiation or ion implantation.

In order to achieve the fourth object, the invention provides a second semiconductor device for being mounted on a compound semiconductor substrate and functioning as an FET, includes an active layer formed on a portion of the compound semiconductor substrate and functioning as a channel region; a gate electrode formed on the active layer; source and drain electrodes formed at positions on the active layer located at opposite sides of the gate electrode and spaced from the gate electrode; and insulator layers made of a semiconductor provided with an insulating property and interposed between the drain electrode and the gate electrode and between the source electrode and the gate electrode, respectively.

In the second semiconductor device, semiconductor layers of a low resistance may be interposed between the source electrode and the active layer and between the drain electrode and the active layer, respectively.

In the second semiconductor device, a length in the channel direction of the insulator layer near the source electrode may be smaller than a length in the channel direction of the insulator layer near the drain electrode.

Owing to the above structure, since the insulator layers are interposed between the gate and drain and between the gate and source of the FET, the gate/drain capacity and the gate/source capacity are remarkably small, so that the high-frequency properties such as a maximum cut-off frequency and a maximum oscillation frequency are improved. Further, only the insulator layer is removed by the etching which is carried out to form a space for forming the gate electrode, so that distances by which the gate electrode is spaced from the source and drain electrodes do not change due to variation in the etching conditions. Therefore, a high drain breakdown voltage can always be maintained, and the high-frequency properties are significantly improved.

Other objects, features, and advantages of the invention will appear more fully from the following detailed description thereof taken in connection with the accompanying drawings.

BRIEF DESCRIPTION OF THE DRAWINGS

FIG. 27 shows, at (a)–(e), cross sections of a semiconductor structure at different steps in a manufacturing process of a ninth embodiment;

DESCRIPTION OF THE PREFERRED EMBODIMENTS (First Embodiment)

A method of manufacturing a field-effect transistor according to a first embodiment of the invention will be described below with reference to FIGS. 1 to 4.

Figure 1A:
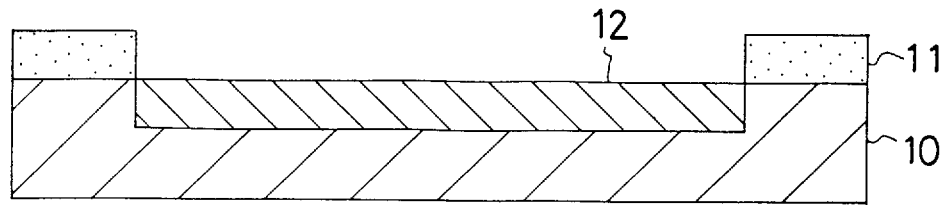
FIG. 1 shows, at (a)–(c), cross sections of a semiconductor structure at steps not later than deposition of a first insulating film in a manufacturing process of a first embodiment, respectively.
Figure 1B:
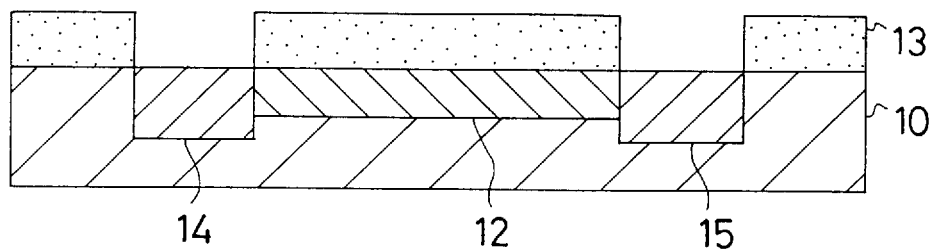
Figure 1C:
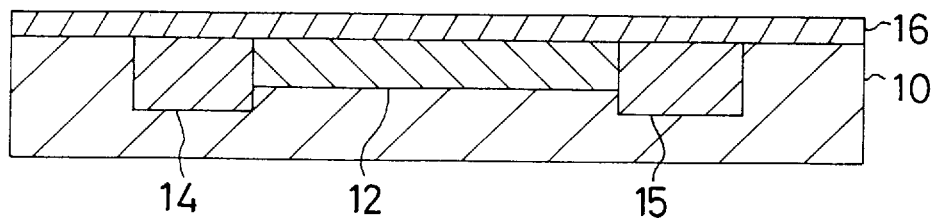

As shown at (a) in FIG. 1, a first resist mask 11 is formed on a main surface of a semi-insulating GaAs substrate 10, which is a compound semiconductor substrate, by photolithography, and then, using the first resist mask 11, Si ions are implanted into a predetermined region of the GaAs substrate 10 with an acceleration voltage of 80 keV to form an n-type active layer 12.

As shown at (b) in FIG. 1, a second resist mask 13 is formed on the main surface of the GaAs substrate 10 by photolithography, and then, using the second resist mask 13, Si ions are implanted into predetermined regions of the active layer 12 with 150 keV to form source and drain regions 14 and 15 of an $n^+$-type.

As shown at (c) in FIG. 1, a first insulating film, i.e., a silicon oxide film 16 is deposited entirely on the main surface of the GaAs substrate 10, and then annealing is effected under a temperature of 820° C. for 15 minutes to activate the implanted Si using the silicon oxide film 16 as a protection film.

Figure 2A:
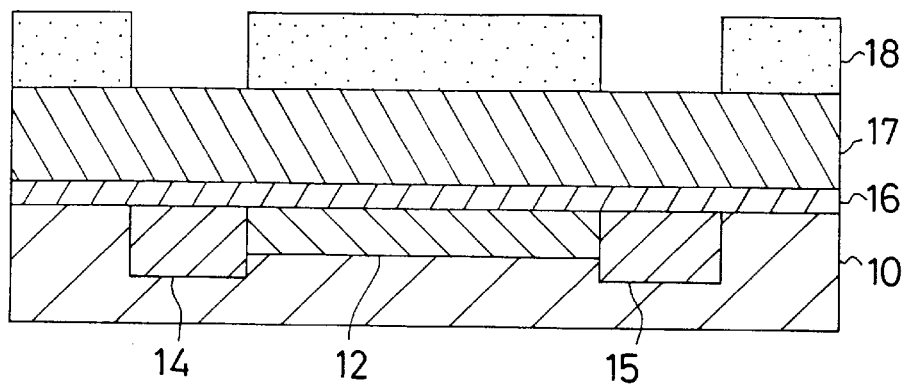
FIG. 2 shows, at (a)–(c), cross sections of the semiconductor structure at steps not later than formation of a resist mask for forming a gate in the manufacturing process of the first embodiment, respectively.
Figure 2B:
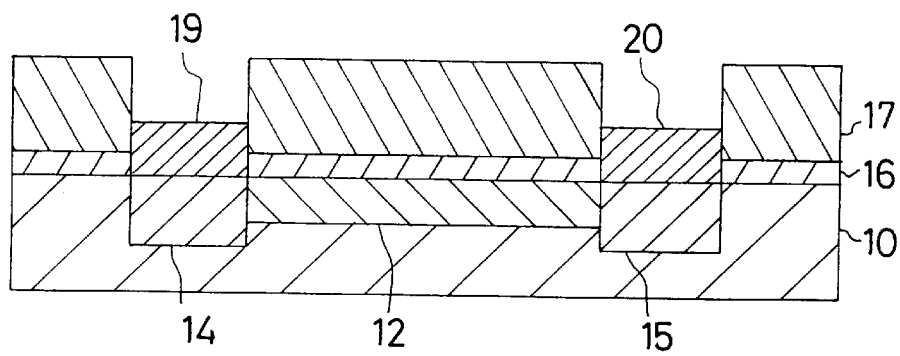
Figure 2C:
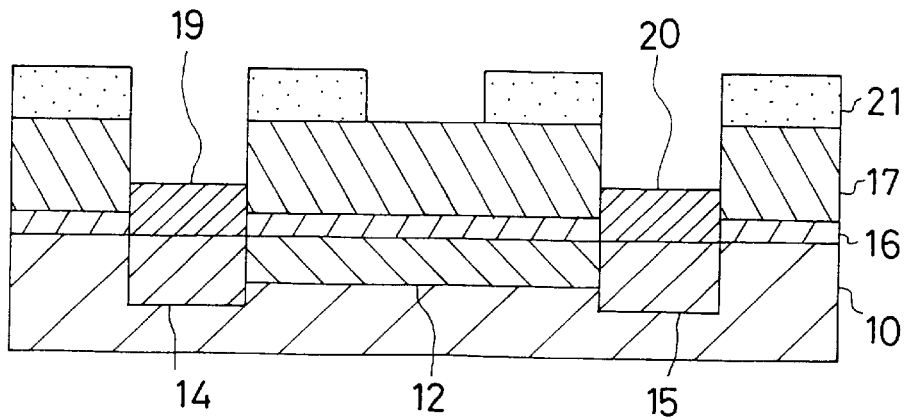

As shown at (a) in FIG. 2, a second insulating film, i.e., a silicon nitride film 17 is deposited on the silicon oxide film 16, and then a third resist mask 18 having openings at regions for forming source/drain electrodes is formed on the silicon nitride film 17 by photolithography.

As shown at (b) in FIG. 2, the silicon oxide film 16 and the silicon nitride film 17 are etched to form openings at them using the third resist mask 18. After effecting vacuum deposition of AuGe/Ni/Au on inner surfaces of the above openings, sintering is carried out in an atmosphere of an Ar gas under a temperature of 450° C. for 3 minutes to form a source electrode 19 and a drain electrode 20 made of ohmic electrodes.

As shown at (c) in FIG. 2, a fourth resist mask 21 having an opening at a region for forming a gate electrode is formed on the silicon nitride film 17 by photolithography.

Figure 3A:
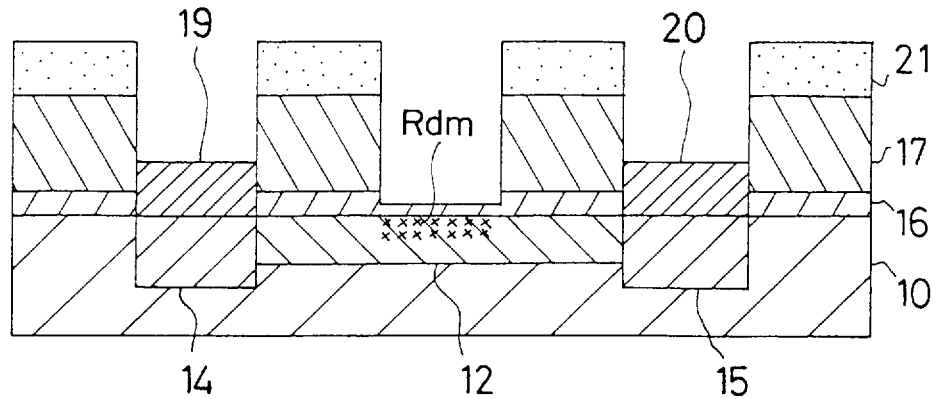
FIG. 3 shows, at (a)–(c), cross sections of the semiconductor structure at steps not later than the end of recess etching in the manufacturing process of the first embodiment, respectively.
Figure 3B:
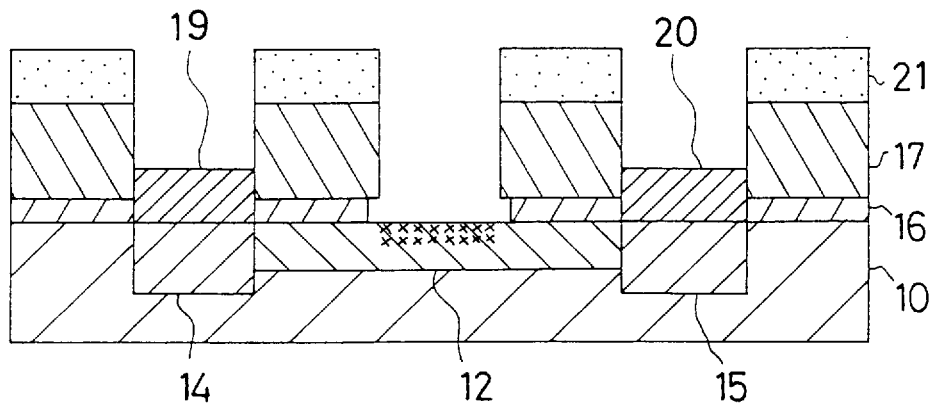
Figure 3C:
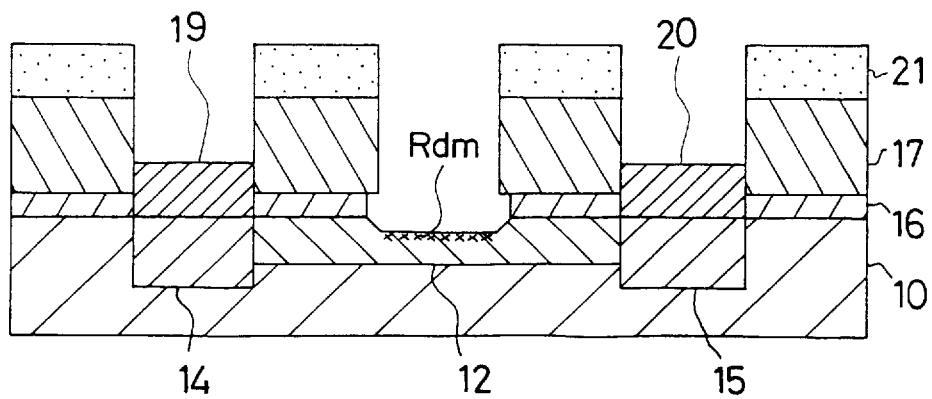

As shown at (a) in FIG. 3, reactive dry etching (which will be referred to as an RIE) is effected on the silicon nitride film 17 with a $CF_4$ gas. In this embodiment, since the silicon nitride film 17 is 0.5 μm in thickness, the etching of the silicon nitride film 17 takes only about 4 minutes and 30 seconds. In the first embodiment, however, the overetching is effected on the silicon nitride film 17 for 60 seconds so as to remove an upper layer portion of the silicon oxide film 16 at the gate electrode formation region and reduce the carrier concentration of a portion of the active layer 12 immediately under the gate electrode. In this case, since the etching rate of the silicon oxide film 16 by RIE is lower than the etching rate of the silicon nitride film 17 by the RIE, the above etching removes the silicon oxide film 16 by 60–80%.

As shown at (b) in FIG. 3, wet etching is effect with an HF liquid solution to remove the portion of the silicon oxide film 16 at the gate electrode formation region.

As shown at (c) in FIG. 3, the gate electrode formation region is etched with a tartaric acid solution to form a recess structure. The recess structure is formed for the purpose of adjusting a current to a predetermined value, and the recess may have a depth of about 10 nm at the most. Since a conventional recess has a depth from 50 to 100 nm, the recess depth in this embodiment is significantly smaller than the recess depth in the prior art. In this embodiment, therefore, variation in the recess depth does not substantially cause a problem.

Figure 4A:
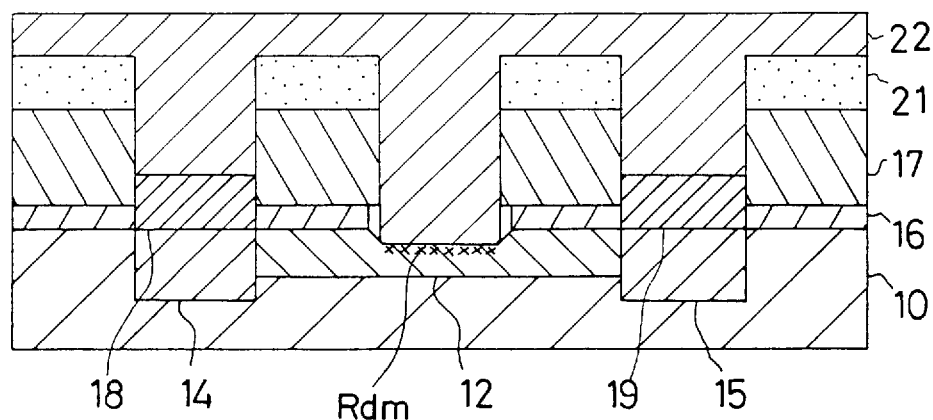
FIG. 4 shows, at (a) and (b), cross sections of the semiconductor structure at steps not later than formation of a gate electrode in the manufacturing process of the first embodiment, respectively.
Figure 4B:
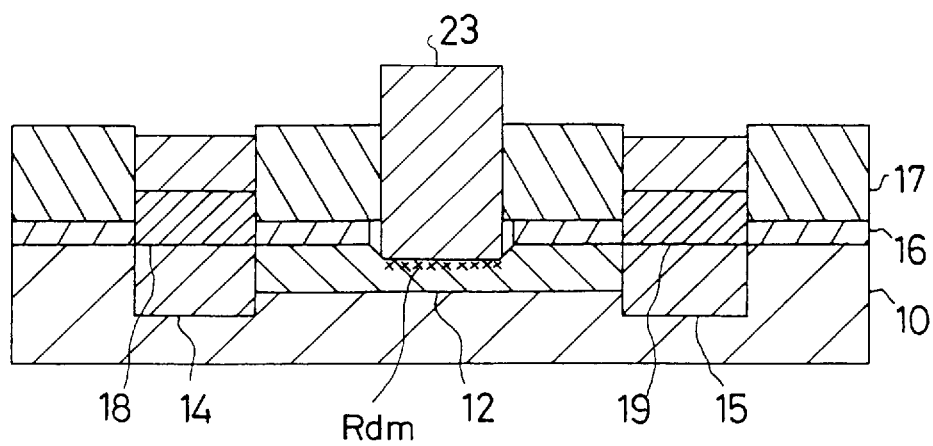

As shown at (a) in FIG. 4, after depositing a metal film 22 which will form the gate electrode on the entire surface, lift-off is effected on the metal film 22 to form a gate electrode 23.

An important point in the first embodiment is that the silicon oxide film 16 is slightly etched by the overetching effected on the silicon nitride film 17. It can be considered that this overetching acts through the silicon oxide film 16 on the portion of the active layer 12 immediately under the gate electrode 23 and thereby reduces the carrier concentration of the above portion, resulting in improvement of the gate/drain breakdown voltage.

Figure 5:
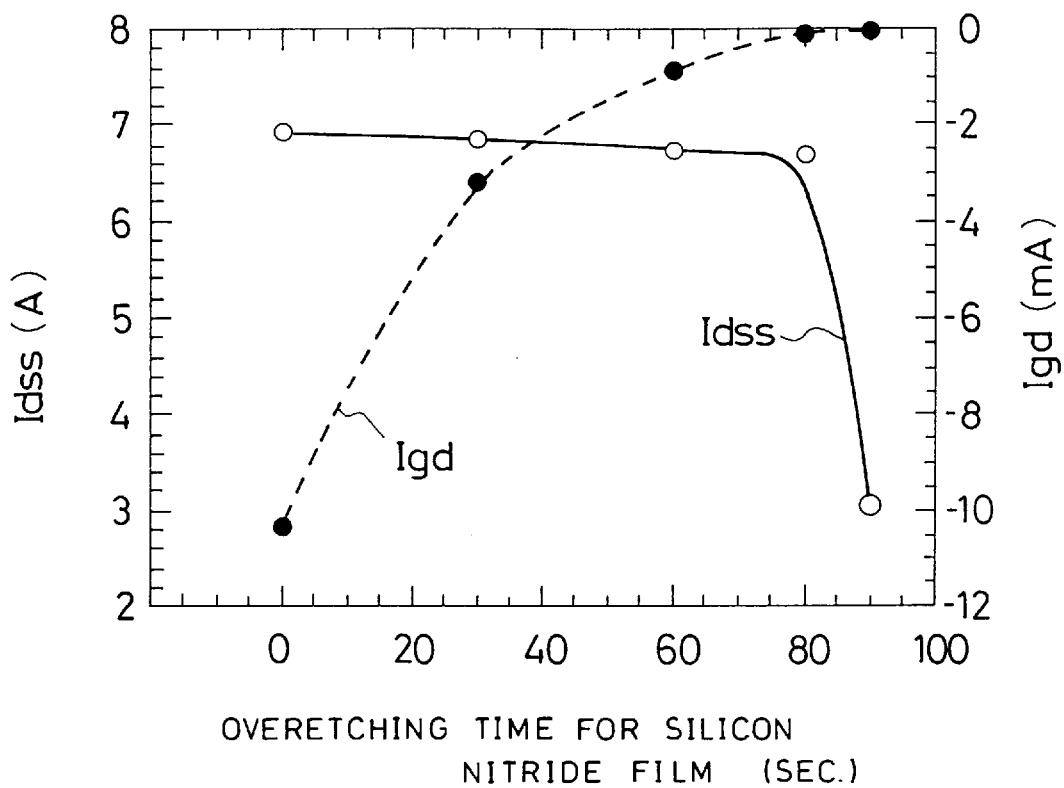
FIG. 5 shows a relationship between an overetching time for a silicon nitride film, a value Idss of a source/drain current, and a value Igd of a gate/drain current in a method of manufacturing an FET according to the first embodiment.

FIG. 5 shows a relationship between an overetching time for the silicon nitride film 17, a value Idss of a current flowing between the source and drain, and a value Igd of a current flowing between the gate and drain in the method of manufacturing the field-effect transistor having a gate width Wg of 36 mm and a gate length Lg of 1.0 μm according to the first embodiment. The source/drain current value Idss is measured with a gate potential of 0V, and a larger value is better as the property of the power FET. The gate/drain current value Igd is measured when 15V is applied in the Shottky reverse direction across the gate and drain, and a smaller absolute value thereof provides a better gate/drain breakdown voltage.

As can be seen from FIG. 5, if the overetching time for the silicon nitride film 17 is in a range from 0 to 80 seconds, the source/drain current Idss does not substantially change, and the gate/drain current Igd decreases. However, the overetching for 90 seconds rapidly reduces the source/drain current Idss. By setting the overetching time within 80 seconds, therefore, the gate/drain current Igd can be reduced to about 1/10 while maintaining the FET properties similarly to those of the conventional FET. It can be considered that this is owing to the fact that the appropriate overetching time controls the carrier concentration of the portion of the active layer 12 immediately under the gate electrode.

Figure 6A:
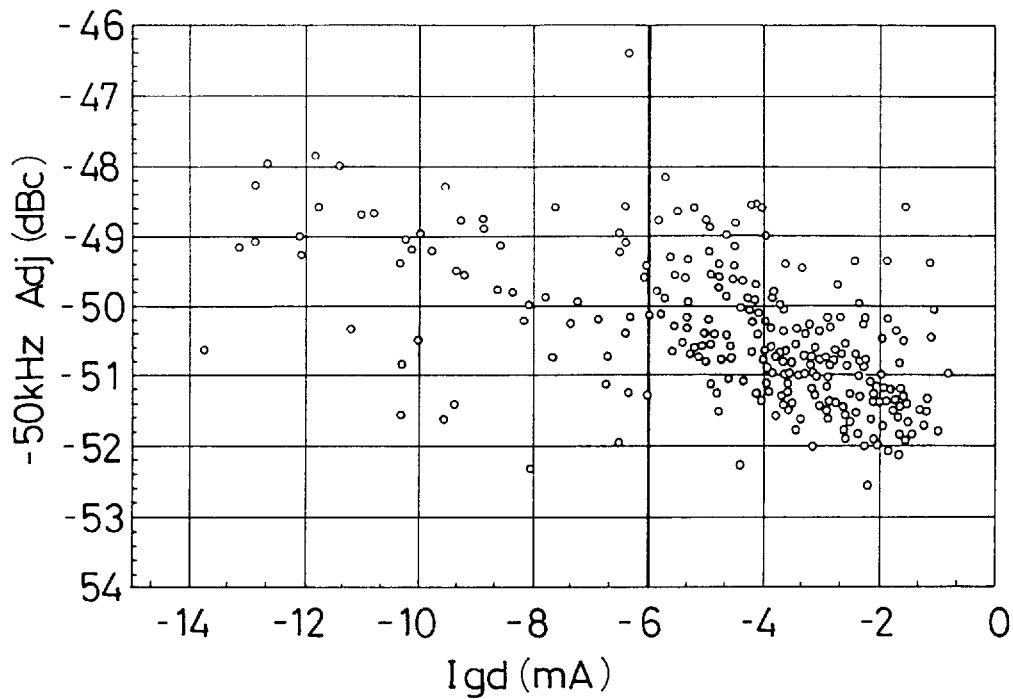
FIG. 6 shows at (a) a relationship between a value Igd of a gate/drain current and an adjacent channel leak power suppression ratio at the time of 50 kHz detuning in a power FET produced by a method of manufacturing an FET according to the first embodiment, and shows at (b) a relationship between the value Igd of the gate/drain current and the adjacent channel leak power suppression ratio at the time of 100 kHz detuning.
Figure 6B:
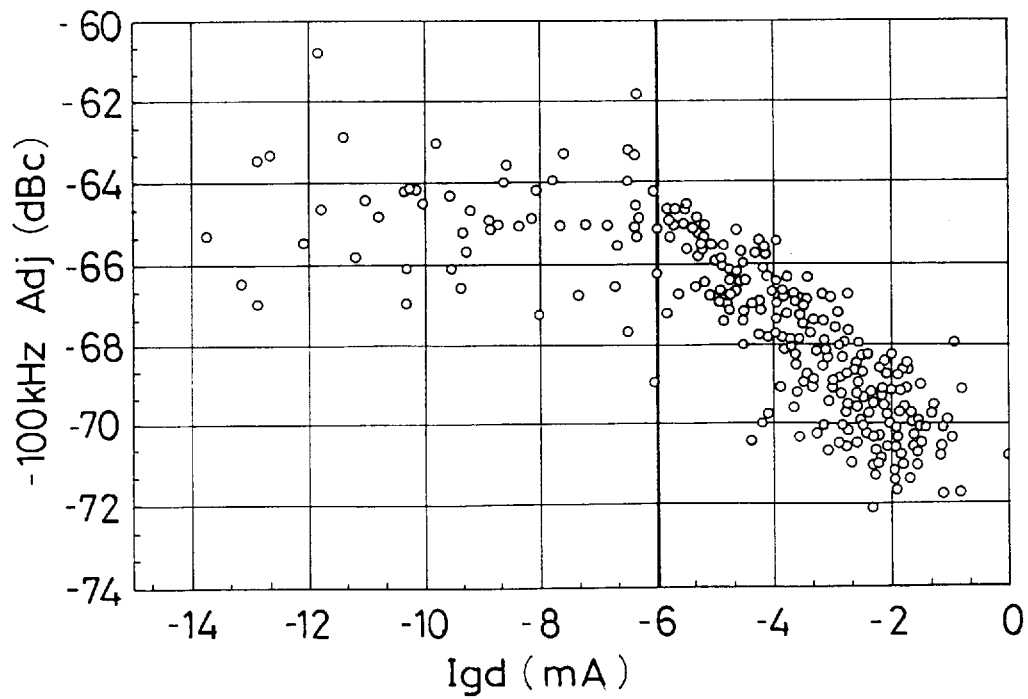

FIG. 6 shows a result of measurement of the high-frequency properties of the power FET produced by the method of manufacturing the field-effect transistor according to the first embodiment.

Figure 7:
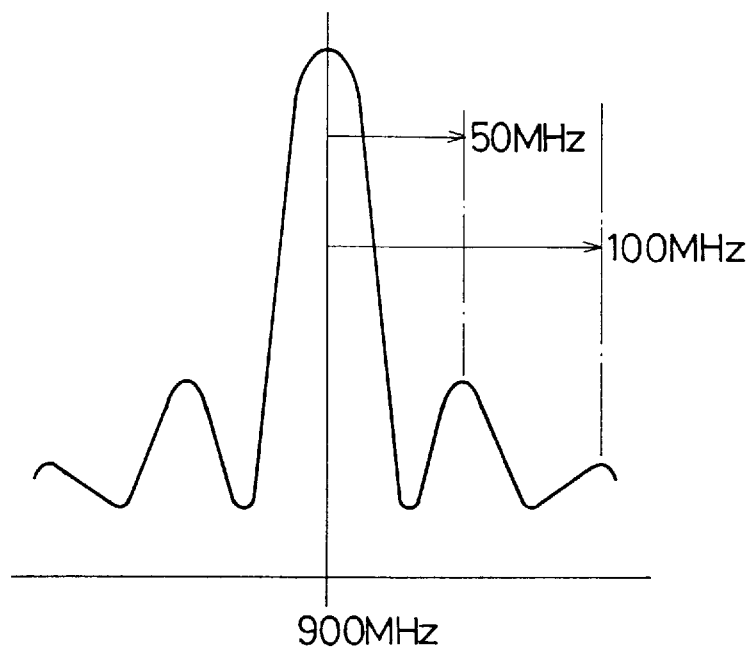
FIG. 7 shows 50% and 100% detuning shown in FIG. 6.

At (a) and (b) in FIG. 6 are shown a result of measurement of an adjacent channel leak power suppression ratio (Adj) at the times of 50 kHz and 100 kHz detuning, respectively, and this ratio is a most important factor in a communication system using digital modulation. The ratio Adj is a ration between a peak and a noise level of a signal at 900 MHz. At (a) in FIG. 6, Adj at −50 kHz is a value of a noise measured at a position spaced from 900 MHz by 50 kHz, and −100 kHz Adj at (b) in FIG. 6 is a value of a noise measured at a position spaced from 900 MHz by 100 kHz (see FIG. 7). The larger in absolute value of the ratio between the peak and noise level of the signal is better. The smaller absolute value of the gate/drain current Igd is better.

Assuming that the gate/drain current Igd positively larger than −6 is acceptable, the acceptable factor of field-effect transistors manufactured by the method of the first embodiment is about 80% at (a) in FIG. 6, and it is about 90% at (b) in FIG. 6. Since (b) in FIG. 6 relates to the noise at the position spaced by 100 kHz from the signal peak, the acceptable factor at (b) in FIG. 6 is naturally larger than that at (a) in FIG. 6 and is about 90%. According to the method of manufacturing the field-effect transistor of the first embodiment, as described above, it is possible to reduce the gate/drain current Igd in spite of the simple structure. Since the gate/drain breakdown voltage can be improved even if the recess depth is reduced, variation in the recess depth can be suppressed, so that the yield can be significantly improved.

Figure 8:
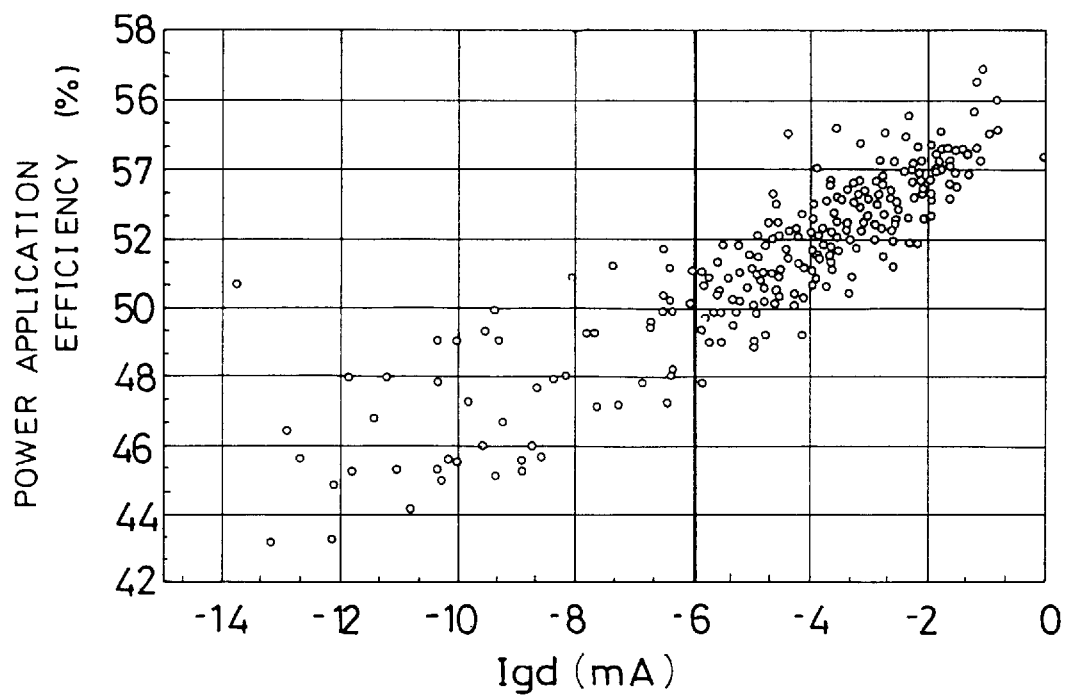
FIG. 8 shows a relationship between a value Igd of a gate/drain current and a power application efficiency in a power FET produced by a method of manufacturing an FET according to the first embodiment.

FIG. 8 shows a relationship between the gate/drain current Igd and the power application efficiency. The power application efficiency is a rate between the power supplied to the gate electrode of the field-effect transistor and the output power. From FIG. 7, it can be seen that the power application efficiency is improved in accordance with reduction in absolute value of the gate/drain current Igd, and thus the field-effect transistor produced by the method of the first embodiment contributes to extension of an allowable maximum transmission time of a portable telephone.

It is generally known that, in an MESFET using a compound semiconductor substrate such as a GaAs substrate, a stress applied to the gate electrode generates piezoelectric charges, which causes variation in the threshold voltage. According to the method of the first embodiment, however, it is possible to reduce the carrier concentration only at the portion of the active layer immediately under the gate electrode, so that generation of the piezoelectric charges themselves is suppressed, and hence variation in the threshold voltage is suppressed.

As can be understood from description with reference to FIGS. 5, 6 and 8, the method of the first embodiment exerts a significant influence on stabilization of properties of the MESFET and improvement of the yield.

Figure 9:
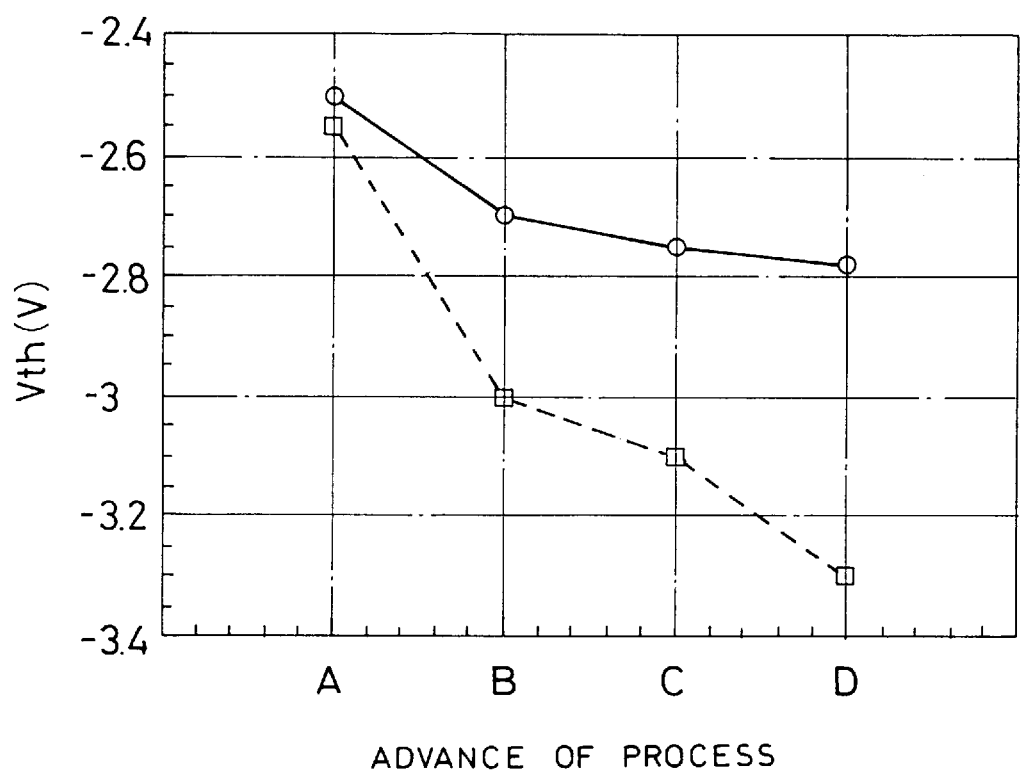
FIG. 9 shows variation in a threshold voltage Vth caused by a stress applied to a gate electrode and changing in accordance with advance of process in a method of manufacturing an FET according to the first embodiment.

FIG. 9 shows variation in the threshold voltage Vth caused by the stress which is applied to the gate electrode and is variable in accordance with progress of the process of manufacturing the field-effect transistor. In FIG. 9, solid line represents the first embodiment, and dotted line represents the conventional method. It can be seen therefrom that the method of the first embodiment can suppress variation in the threshold voltage Vth.

In the first embodiment, the wet etching is carried out to remove the lower layer portion of the silicon oxide film 16 remaining after the overetching for the silicon nitride film 17. Alternatively, low-damage dry etching such as chemical dry etching may be employed for removing it.

(Second Embodiment)

The first embodiment already described relates to the MESFET using the ion implantation for forming the active layer. However, the invention can provide a similar effect even if the MESFET uses a crystal growth method for forming the active layer. The MESFET utilizing the crystal growth method will be described below as the second embodiment with reference to FIGS. 10 to 12.

Figure 10A:
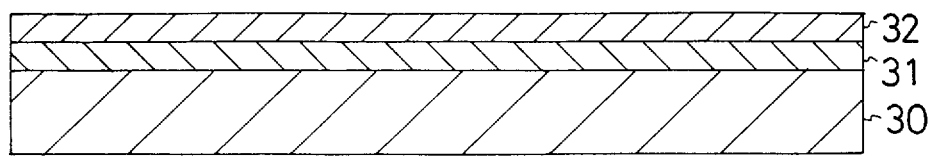
FIG. 10 shows, at (a)–(c), cross sections of a semiconductor structure at steps not later than patterning of first and second insulating films in a manufacturing process of a second embodiment.
Figure 10B:
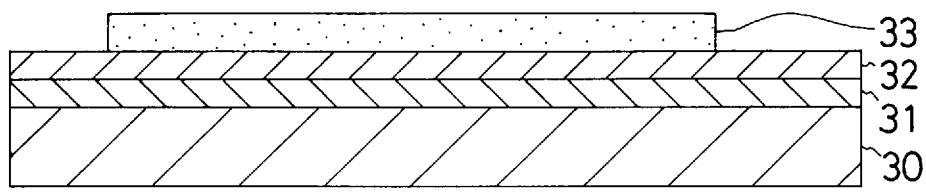
Figure 10C:
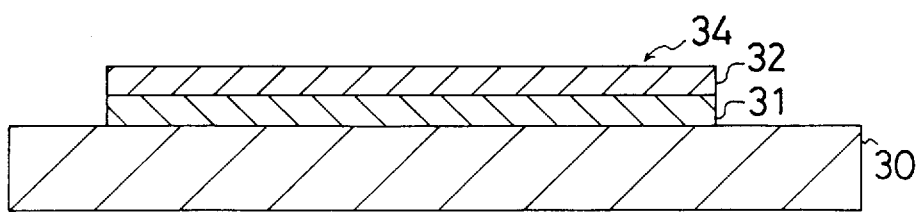

As shown at (a) in FIG. 10, an MBE (Molecular Beam Epitaxy) method is executed to form a GaAs active layer 31, which is doped with impurity of Si at a concentration of $1 \times 10^{17}$ cm$^{-3}$, and a GaAs heavily doped layer 32, which is doped with impurity of Si at a concentration of $5 \times 10^{18}$ cm$^{-3}$, on a GaAs substrate 30 by crystal growth. In this case, the GaAs active layer 71 is 0.2 μm in thickness, and a GaAs heavily doped layer 72 is 50 nm in thickness.

As shown at (b) in FIG. 10, a first resist mask 33 is formed at a predetermined region on the GaAs heavily doped layer 32, and then mesa-etching is effected on the GaAs active layer 31 and the GaAs heavily doped layer 32 using the first resist mask 33 as a mask to form an FET region 34 as shown at (c) in FIG. 10.

Figure 11A:
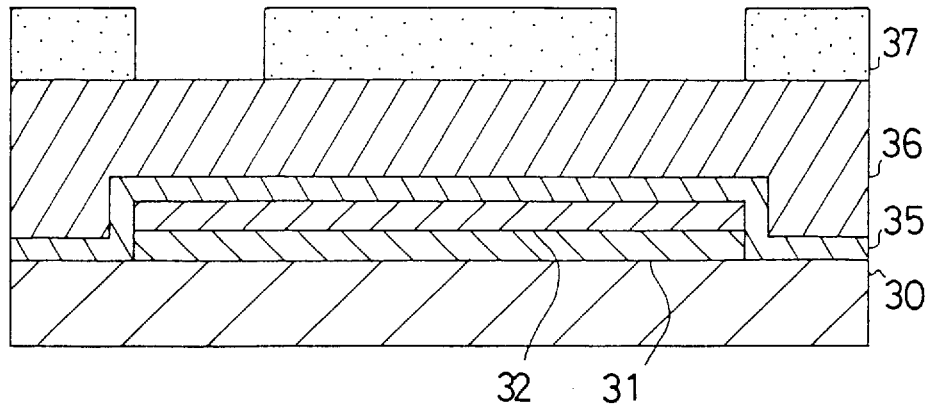
FIG. 11 shows, at (a)–(c), cross sections of a semiconductor structure at steps not later than formation of a resist mask for forming a gate in a manufacturing process of the second embodiment.
Figure 11B:
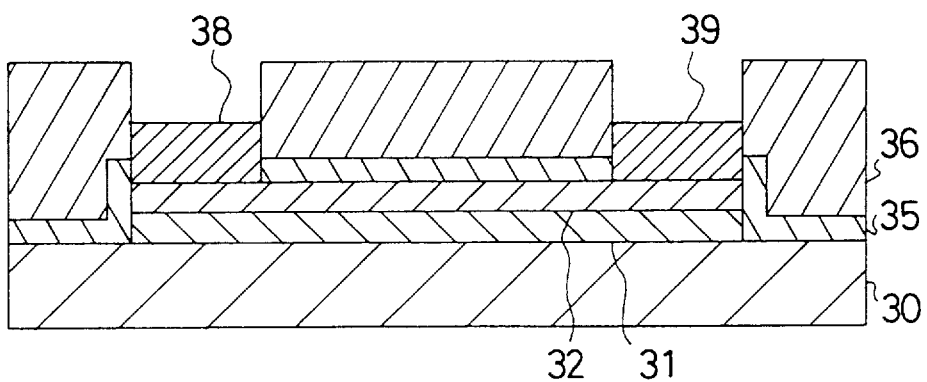
Figure 11C:
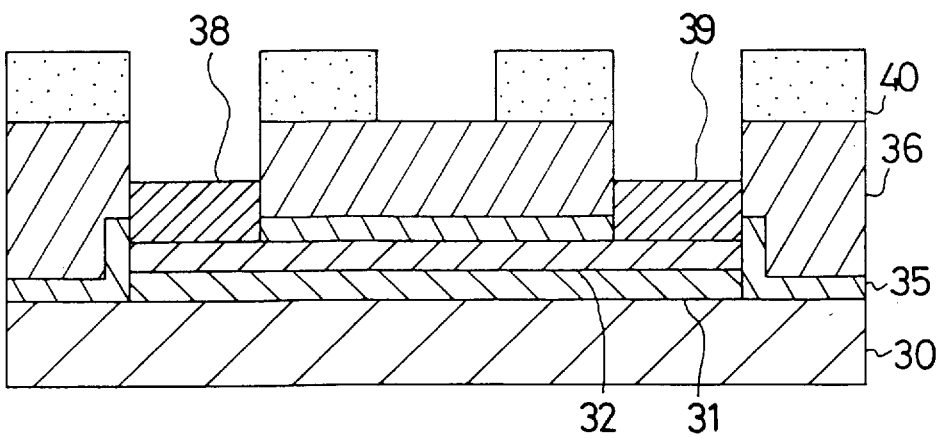

As shown at (a) in FIG. 11, a silicon oxide film 35 and a silicon nitride film 36 are successively formed on the whole surface of the GaAs substrate 30, and then a second resist mask 37 having openings at the source/drain formation regions is formed on the silicon nitride film 36.

Then, as shown at (b) in FIG. 11, the silicon oxide film 35 and the silicon nitride film 36 are etched using the second resist mask 37 to form openings for forming source/drain regions, and then these openings are filled with electrode metal to form source and drain electrodes 38 and 39.

As shown at (c) in FIG. 11, a third resist mask 40 including an opening at a gate electrode formation region is formed on the silicon nitride film 36.

Figure 12A:
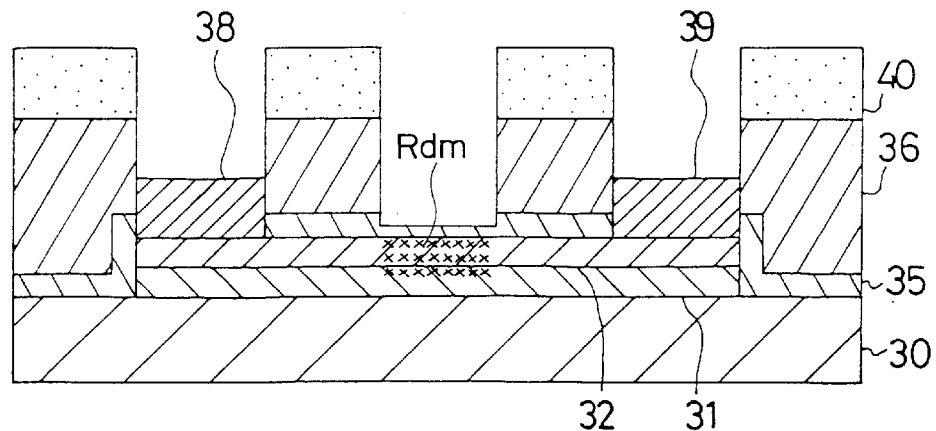
FIG. 12 shows, at (a)–(c), cross sections of a semiconductor structure at steps not later than formation of a gate electrode in a manufacturing process of the second embodiment.
Figure 12B:
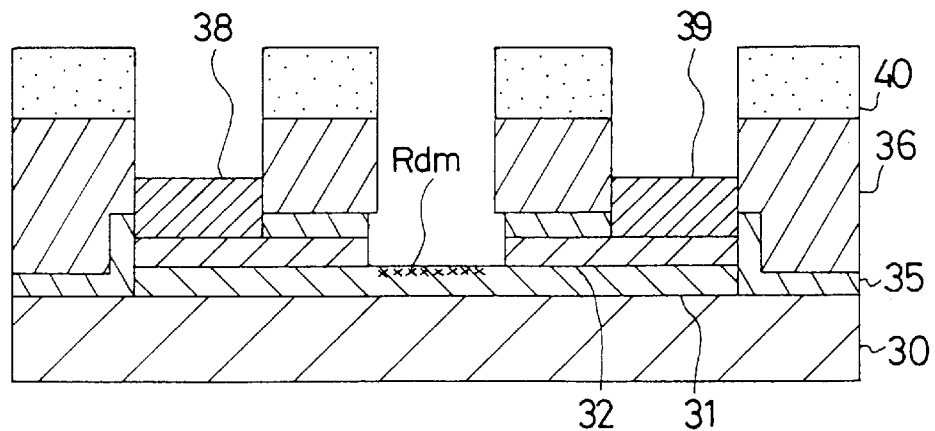
Figure 12C:
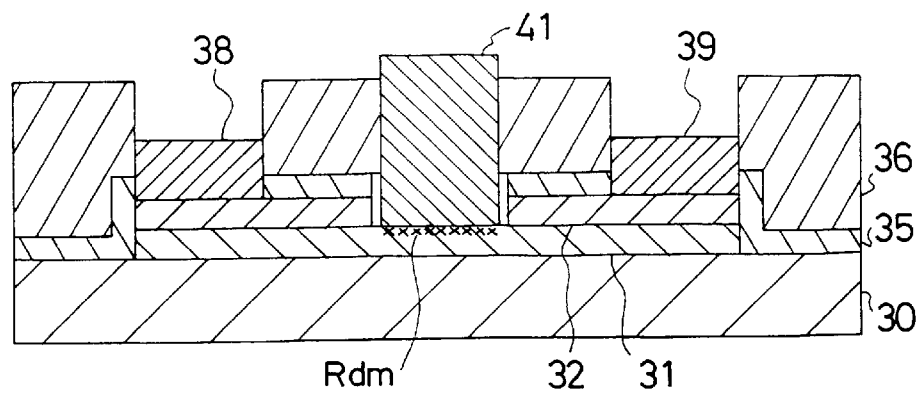

As shown at (a) in FIG. 12, the silicon nitride film 36 is etched using the third resist mask 40. In this case, overetching is effected on the silicon nitride film 36 for about 60 seconds similarly to the first embodiment, so that an upper layer portion of the silicon oxide film 35 is removed together with the silicon nitride film 36. In this case, the effect of overetching the silicon nitride film 36 is applied not only to the GaAs heavily doped layer 32 but also to the GaAs active layer 31.

As shown at (b) in FIG. 12, a lower layer portion of the silicon oxide film 36 is removed by the wet etching, and then recess etching is effected on the GaAs heavily doped layer 32. The purpose of removing the GaAs heavily doped layer 32 is to adjust the threshold voltage of the field-effect transistor to an intended value.

As shown at (c) in FIG. 12, the opening at the gate electrode formation region is filled with electrode metal to form a gate electrode 41 on the GaAs active layer 31, so that the field-effect transistor is completed.

In the second embodiment, the epitaxial growth method is used for forming the active layer as described above. The epitaxial growth method used in this manner can provide such an advantage that the FET can be easily manufactured in accordance with the design because the thickness and concentration of the active layer can be easily controlled.

Although the respective embodiments already described employ the active layer of a single n-type, the embodiments may naturally employ (1) a p-type layer buried structure in which a p-type layer is buried under an n-type active layer so that the n-type active layer can be effectively reduced in thickness by utilizing a depletion layer formed by the pn-junction, or (2) a structure using a p-type active layer.

(Third Embodiment)

Although each of the first and second embodiment includes two insulating layers, the concept of the invention can be applied to the case of single insulating layer. The structure including only one insulating layer will be described below as a third embodiment with reference to FIGS. 13 to 16.

Figure 13A:
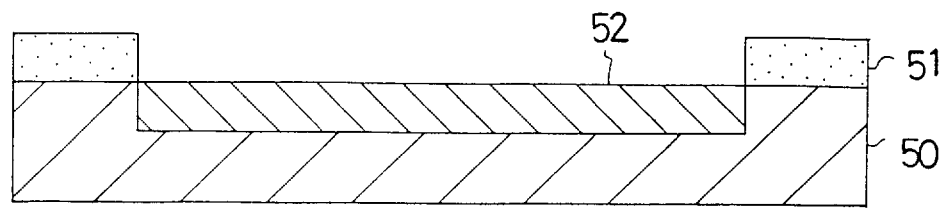
FIG. 13 shows, at (a)–(c), cross sections of a semiconductor structure at steps not later than deposition of a first insulating film in a manufacturing process of a third embodiment.
Figure 13B:
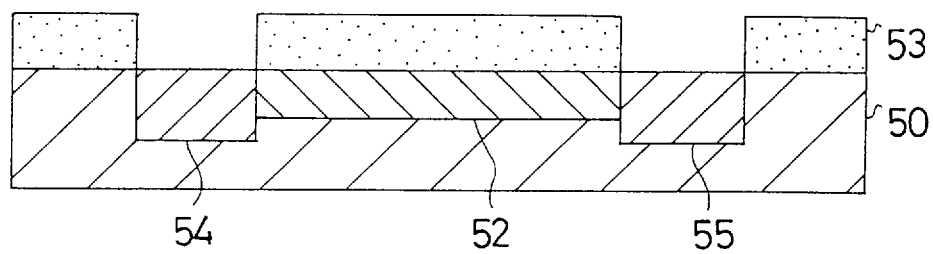
Figure 13C:
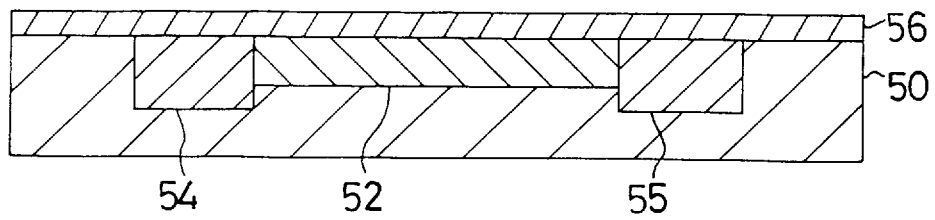

First, as shown at (a) in FIG. 13, a first resist mask 51 is formed on a main surface of a GaAs substrate 50, and then Si ions are implanted with an acceleration voltage of 80 keV into a predetermined region of the GaAs substrate 50 using the first resist mask 51 to form an n-type active layer 52.

As shown at (b) in FIG. 13, after forming a second resist mask 53 on the main surface of the GaAs substrate 50, Si ions are implanted with an acceleration voltage of 150 keV into a predetermined region of the active layer 52 using the second resist mask 53 to form n$^+$-type source and drain regions 54 and 55.

As shown at (c) in FIG. 13, a first insulating film 56 made of, e.g., a silicon oxide film is deposited entirely on the main surface of the GaAs substrate 50, and then annealing is effected using the first insulating film 56 as a protection film to activate the implanted Si.

Figure 14A:
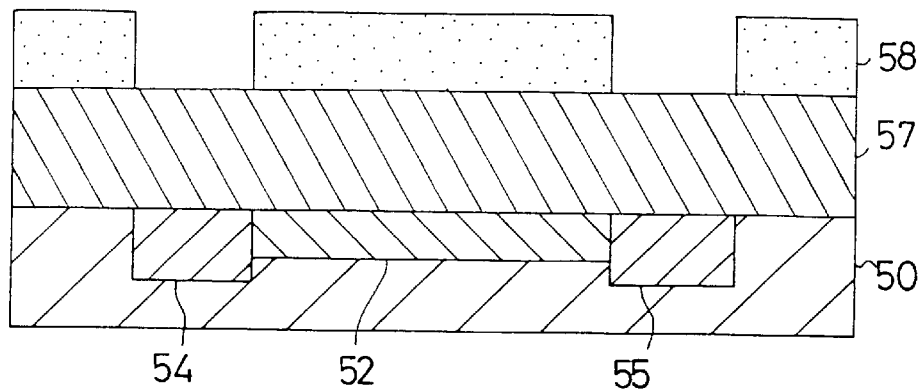
FIG. 14 shows, at (a)–(c), cross sections of a semiconductor structure at steps not later than formation of a gate electrode in a manufacturing process of the third embodiment.
Figure 14B:
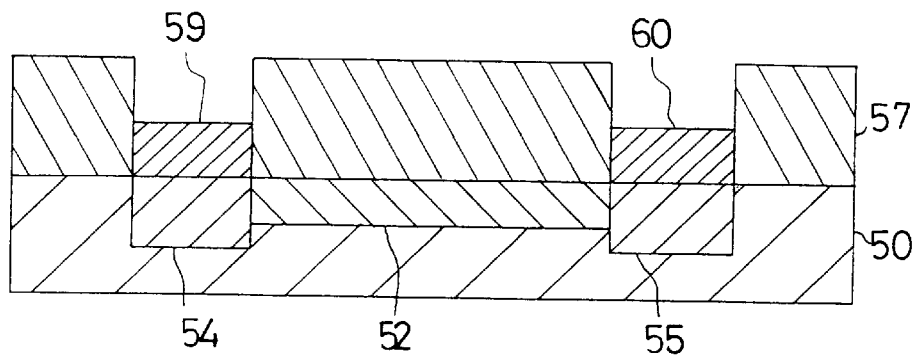
Figure 14C:
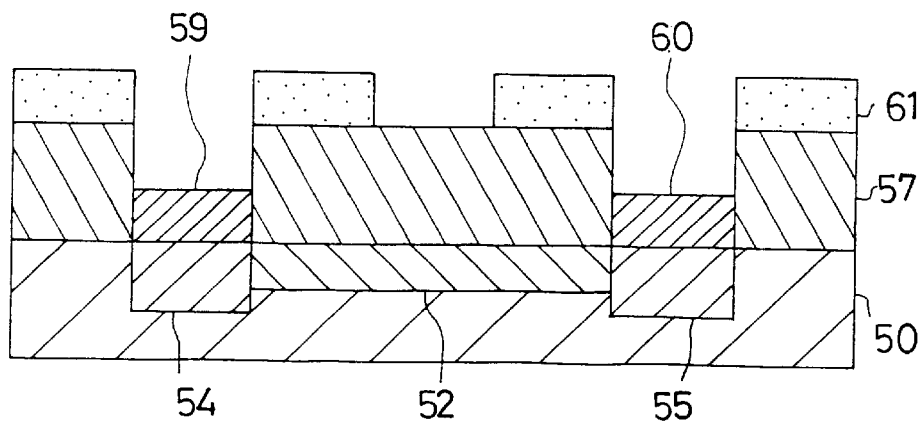

As shown at (a) in FIG. 14, after removing the first insulating film 56, a second insulating film 57 made of, e.g., silicon nitride film is deposited entirely on the whole surface of the GaAs substrate 50, and then a third resist mask 58 having openings at source/drain gate formation regions are formed on the second insulating film 57.

As shown at (b) in FIG. 14, the second insulating film 57 is etched using the third resist mask 58 to form openings. Gate formation metal is then deposited in the openings to form source and drain electrodes 59 and 60.

As shown at (c) in FIG. 14, a fourth resist mask 61 including an opening at a gate electrode formation region is formed on the second insulating film 57.

Figure 15A:
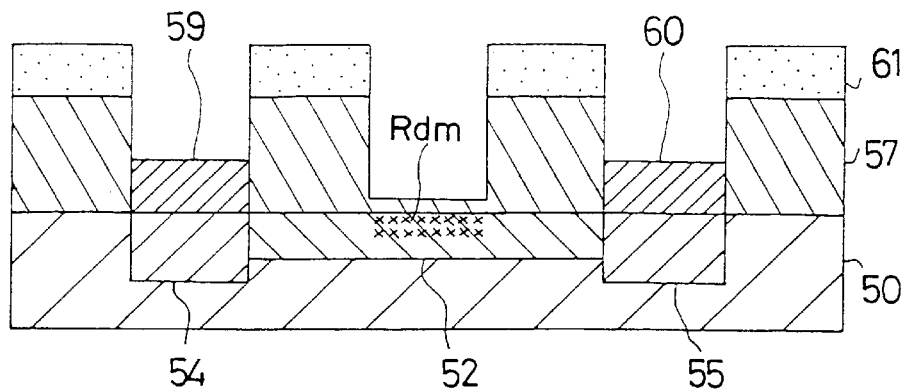
FIG. 15 shows, at (a)–(c), cross sections of a semiconductor structure at steps not later than recess etching in a manufacturing process of the third embodiment.
Figure 15B:
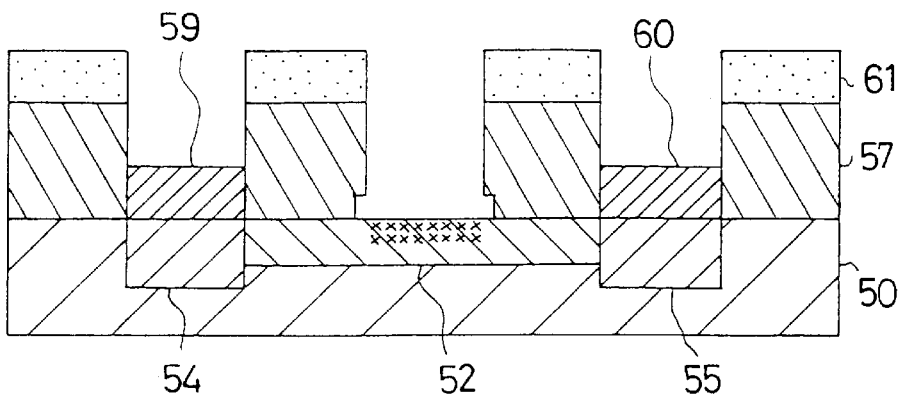
Figure 15C:
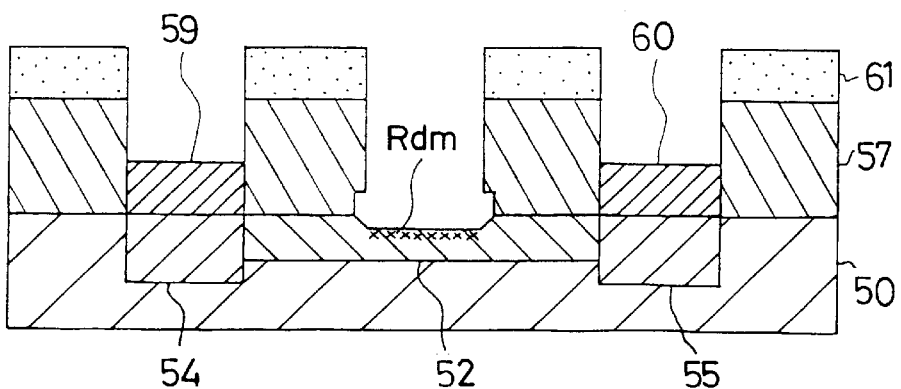

As shown at (a) in FIG. 15, reactive dry etching is effected on the second insulating film 57. This etching is terminated when the film thickness of the second insulating film 57 at the gate electrode formation region is reduced to about 30 nm. This value of film thickness allows reduction of the carrier concentration at the active layer 52 immediately under the gate electrode by the reactive dry etching. Thereby, a preferable influence is exerted on a portion of the active layer 52 immediately under the gate electrode, and the gate/drain breakdown voltage of the field-effect transistor is improved. Therefore, it is preferable to determine experimentally an appropriate film thickness of the second insulating film 57 to be left after the reactive dry etching.

As shown at (b) in FIG. 15, the second insulating film 57 which remains after the reactive dry etching is removed by wet etching. In this step, etching liquid for this wet etching penetrates in a direction parallel to the main surface of the GaAs substrate 50, so that side etching is concurrently effected on the second insulating film 57. Therefore, the opening at the gate electrode formation region in the second insulating film 57 has a configuration shown at (b) in FIG. 15.

As shown at (c) in FIG. 15, recess etching is effected on the GaAs substrate 50 to form the recess structure.

Figure 16A:
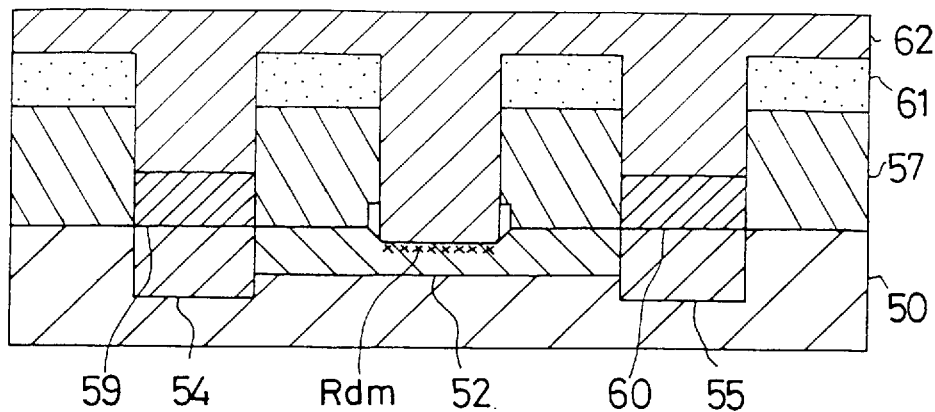
FIG. 16 shows, at (a) and (b), cross sections of a semiconductor structure at steps not later than formation of a gate electrode in a manufacturing process of the third embodiment.
Figure 16B:
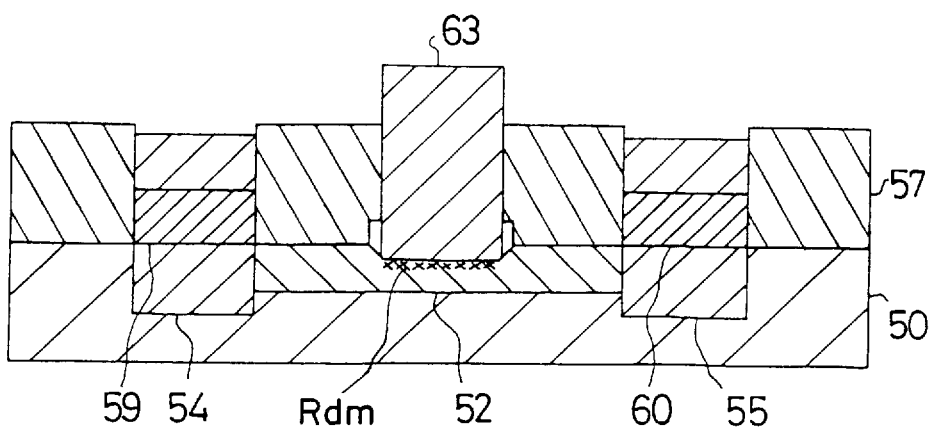

As shown at (a) in FIG. 16, a metal film 62 for forming the gate electrode is deposited on the whole surface, and then, as shown at (b) in FIG. 16, lift-off is effected on the metal film 62 to form the gate electrode 63, whereby the field-effect transistor is completed.

The manufacturing method employing the single insulating film as described above can also provide the properties similar to those by the first embodiment.

In the third embodiment, the wet etching is used to remove the second insulating film 57 remaining after the reactive dry etching. Alternatively, dry etching such as a chemical dry etching applying less damage can be used.

In the third embodiment, the first insulating film 56 is used as the protection film for the annealing. However, the annealing may be carried out without using the protection film.

In the third embodiment, the first insulating film 56 is made of the silicon oxide film, and the second insulating film 57 is made of the silicon nitride film. However, they may be made of other films.

(Fourth Embodiment)

Figure 17A:
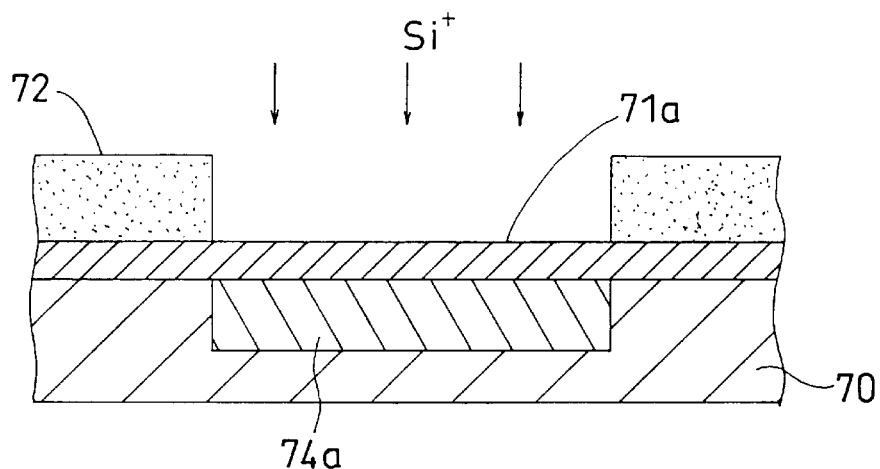
FIG. 17 shows, at (a)–(c), cross sections of a semiconductor structure at steps not later than formation of an on-gate metal film in a manufacturing process of a fourth embodiment.
Figure 17B:
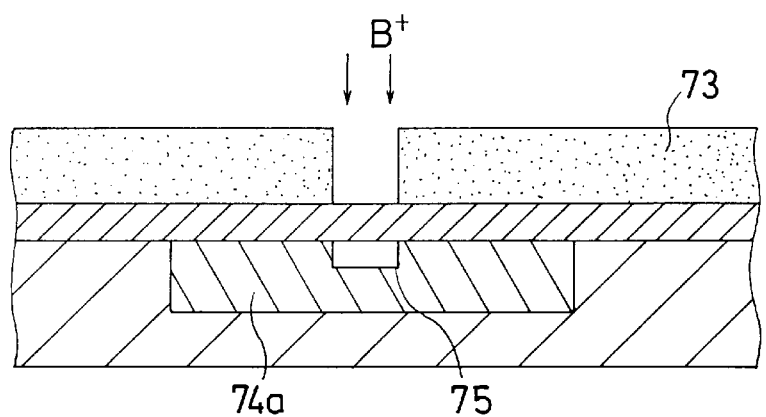
Figure 17C:
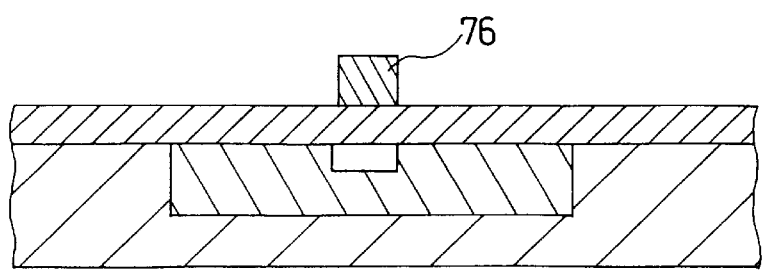
Figure 18A:
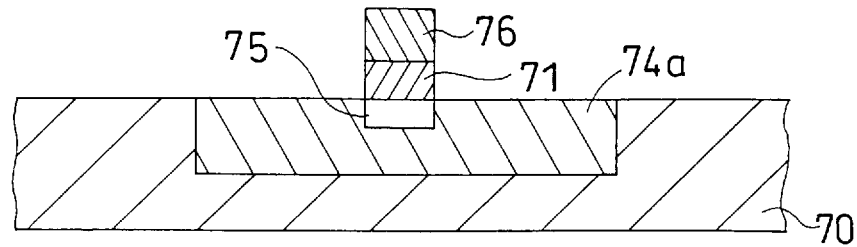
FIG. 18 shows, at (a)–(d), cross sections of a semiconductor structure at steps not later than formation of source and drain electrodes and others in a manufacturing process of the fourth embodiment.
Figure 18B:
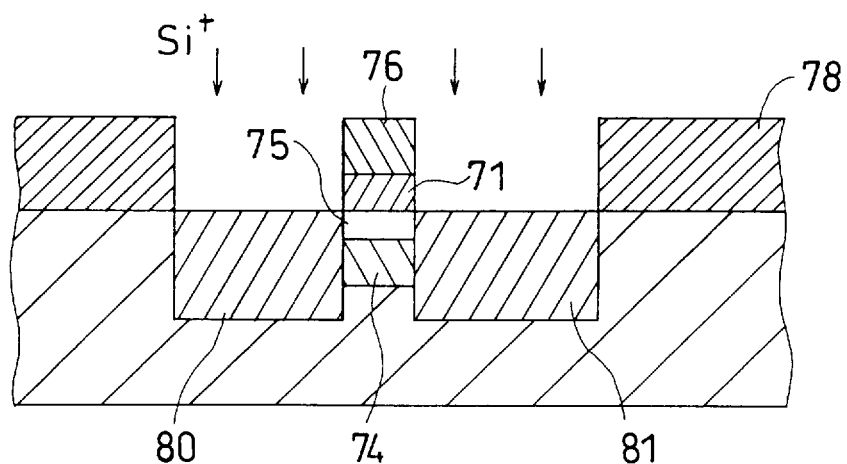
Figure 18C:
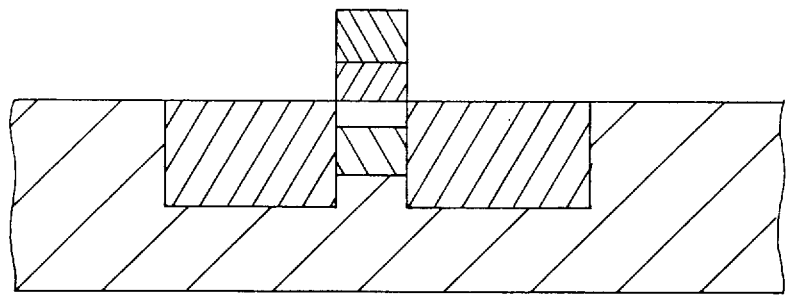
Figure 18D:
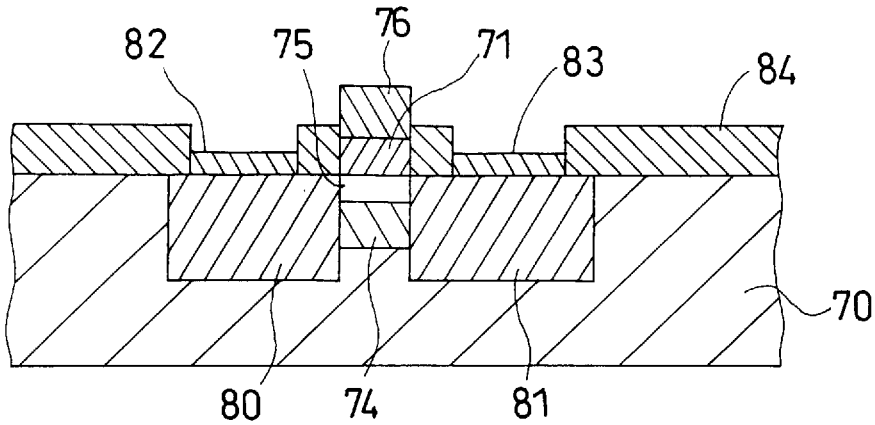

A fourth embodiment will be described below in connection with an example in which the concept of the invention is applied to an MESFET of a self-alignment type. FIGS. 17((a)–(c)) and FIGS. 18((a)–(d)) show cross sections of a semiconductor device at different steps in a manufacturing process according to the fourth embodiment.

As shown at (a) in FIG. 17, a WSi film 71a of 6 nm in thickness is deposited on a main surface of a semi-insulating GaAs substrate 70 by a sputtering method. A first resist mask 72 having an opening in which an active layer of the FET is to be formed is formed on the WSi film 71a by photolithography. Using the first resist mask 72, Si ions are implanted with an acceleration voltage of 30 keV to form an active layer 74a.

As shown at (b) in FIG. 17, a second resist mask 73 having an opening at which a gate is to be formed is formed on the semi-insulating GaAs substrate 70, and using this resist mask 73, B ions are implanted with an acceleration voltage of 10 keV which is lower than the above acceleration voltage for implanting the Si ions. This ion implantation disturbs the crystal structure of the semi-insulating GaAs substrate 70, so that a resistance of a portion containing the implanted ions increases. Thus, a high resistance layer 75 shallower than the active layer 74a is formed at a central region of the active layer 74a.

As shown at (c) in FIG. 17, an Au film is vapor-deposited on the whole surface without removing the second resist mask 73, and then lift-off is carried out to form an on-gate metal film 76 made of Au.

As shown at (a) in FIG. 18, using the on-gate metal film 76 as a mask, reactive ion etching is effected on the WSi film 71a with a $CF_4$ gas to form the gate electrode 71 having the same configuration in plan as the on-gate metal film 71a.

Thereafter, a third resist mask 78 having an opening located above the active layer 74a is formed on the semi-insulating GaAs substrate 70 by photolithography, and then Si ions are implanted with an acceleration voltage of 100 keV to form source and drain regions 80 and 81 which are $n^+$-type regions. In this step, since the acceleration voltage for the Si ions is larger than that for ion implantation for forming the active layer 74a, the source and drain regions 80 and 81 have a larger depth than the active layer 74a. A portion of the active layer 74a which is located under the gate electrode 71, i.e., immediately under the high resistance layer 75 remains as a channel region 74.

As shown at (c) in FIG. 18, the third resist mask 78 is removed, and annealing is effected to activate the implanted Si.

Finally, as shown at (d) in FIG. 18, an SiN film 84 is deposited, and then portions of the SiN film 84 located above the source and drain regions 80 and 81 are partially removed by photolithography. AuGe.Ni.Au is vapor-deposited in the openings, and sintering is carried out in an Ar gas atmosphere at a temperature of 450° C. for three minutes to form source and drain electrodes 82 and 83 which are ohmic electrodes and are located immediately above the source and drain regions 80 and 81, respectively. In this manner, the MESFET is completed.

In the MESFET of the self-alignment type having the structure shown at (d) in FIG. 18, the carrier concentration is distributed in a distinctive fashion particularly at the portion of the GaAs substrate 70 immediately under the gate electrode 71. This will be described below.

Figure 19:
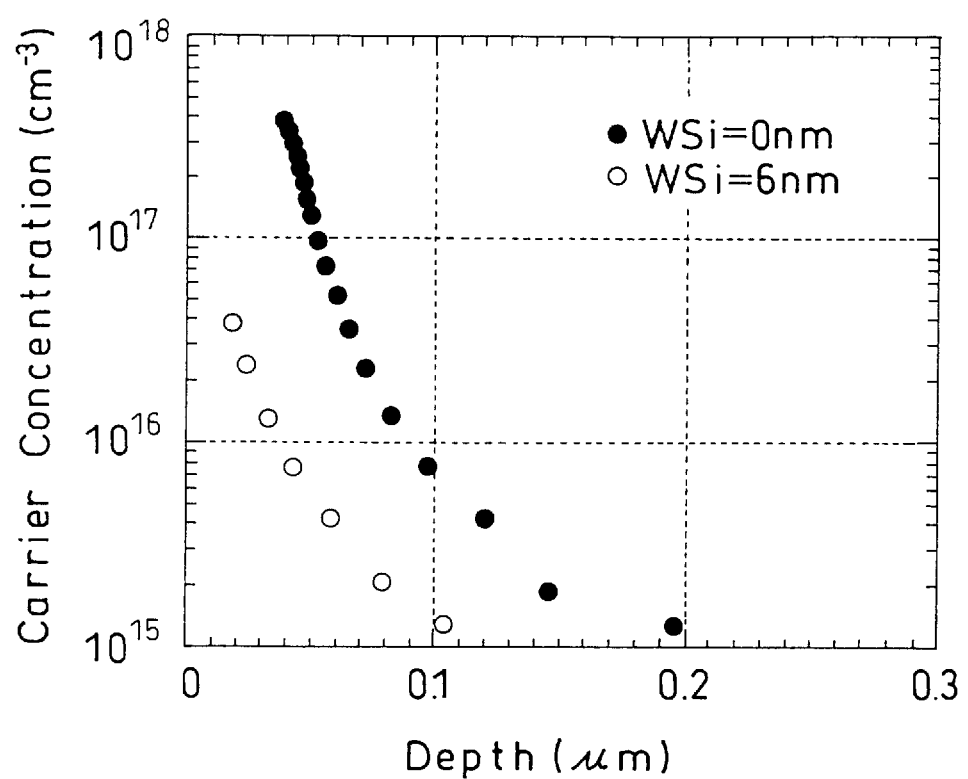
FIG. 19 shows analysis data of SIMS for comparing a carrier profile by through-implantation of impurity ions using a film of the invention with a carrier profile by a conventional bare implantation.

FIG. 19 shows a carrier profile in the case where the through implantation is carried out through the WSi film of 6 nm in thickness according to the invention (the high resistance layer is not formed), and a carrier profile in the case where a bare implantation is carried out (WSi=0 nm). These profiles are obtained by SIMS analysis. In FIG. 19, the abscissa gives a depth from the surface of the semi-insulating GaAs substrate, and the ordinate gives the n-type carrier concentration. As can be understood from comparison between these carrier profiles, this embodiment provides a steep carrier profile showing a large impurity concentration at a small depth. This means that the thickness of the channel region can be reduced extremely, and the k-value, which is inversely proportional to thickness of the channel region, increases and also the transmission conductance gm increases.

In this embodiment, therefore, owing to the through-implantation of Si ions through the WSi film 71a at the step of forming the active layer 74a shown at (a) in FIG. 17, the steep implantation profile is obtained at the channel region 74, and the MESFET can have a high transmission conductance gm, a high k-value and hence a high performance.

Meanwhile, the high resistance layer 75 is formed at the region immediately under the gate electrode 71 at the step shown at (b) in FIG. 18. Therefore, the gate/drain breakdown voltage BVgd can be high.

Thus, this embodiment can simultaneously achieve the two effects, i.e., improvement of gm and k-value and improvement of the gate/drain breakdown voltage, which are generally in a tradeoff relationship. Further, the channel region 84 is spaced from the gate electrode by the lower carrier concentration layer, i.e., high resistance layer 75, so that generation of the piezoelectric charges is suppressed, and the performance of the FET is improved.

In an MESFET having the LDD structure already described with reference to FIG. 35, the through implantation of impurity ions and formation of the high resistance layer immediately under the gate electrode may be employed, as is done in this embodiment, whereby the effects similar to those of this embodiment can be achieved. Particularly in this case, the above LDD structure can achieve miniaturization of the MESFET and improvement of the breakdown voltage. However, the structure is not restricted to the asymmetric structure shown in FIG. 28.

In the case where the through-implantation is employed, the WSi film 71a employed in this embodiment is not essential, and a similar effect can be achieved by another film such as a metal film or an insulating film which has a function of reducing the implantation energy of impurity ions by an appropriate rate.

In this embodiment, the active layer 74a of the MESFET is formed by implantation of impurity ions. However, the active layer 74a may be formed by impurity introduction during the epitaxial crystal growth, in which case the effect can be maintained by formation of the high resistance layer 75 at a later step.

The description of this embodiment has recited the n-channel MESFET in which all the source/drain regions and channel region are made of n-type regions. Naturally, through-implantation of impurity ions and formation of the high resistance layer can achieve an effect similar to that by this embodiment even in an MESFET having an active layer formed of a p-layer buried structure or a p-channel MESFET.

(Fifth Embodiment)

Figure 20A:
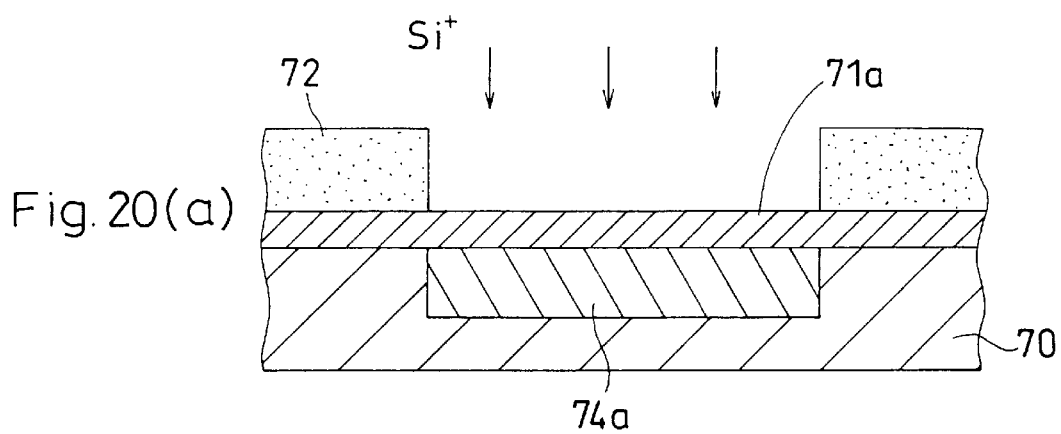
FIG. 20 shows, at (a)–(c), cross sections of a semiconductor structure at steps not later than formation of an on-gate metal film in a manufacturing process of a fifth embodiment.
Figure 20B:
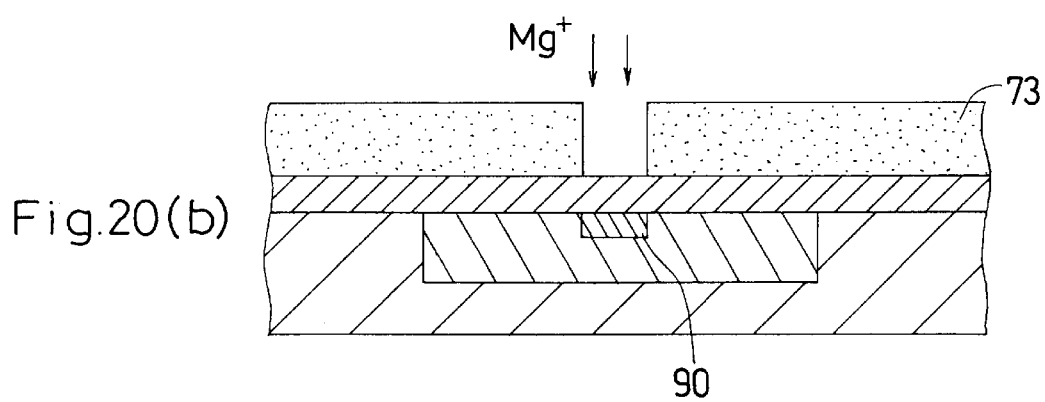
Figure 20C:
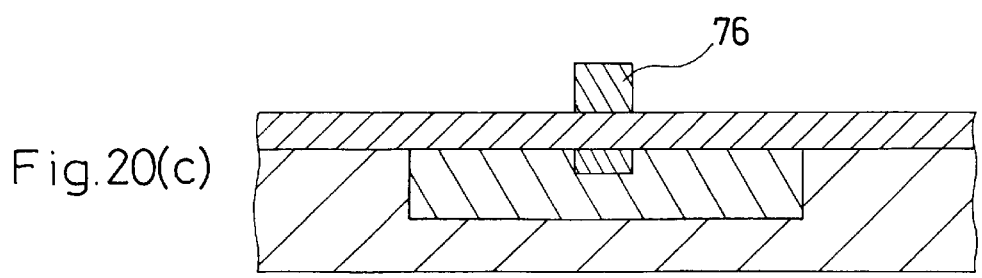
Figure 21A:
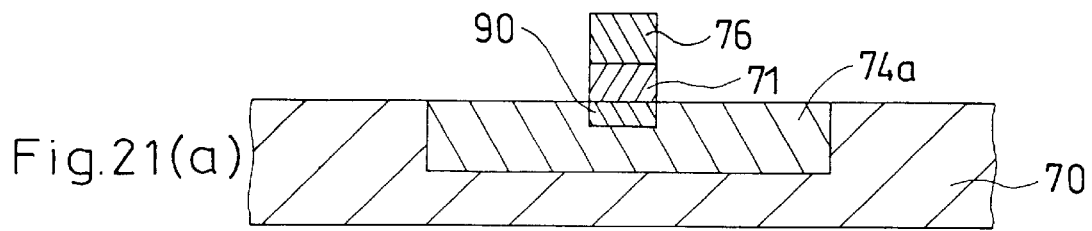
FIG. 21 shows, at (a)–(d), cross sections of a semiconductor structure at steps not later than formation of source and drain electrodes and others in a manufacturing process of the fifth embodiment.
Figure 21B:
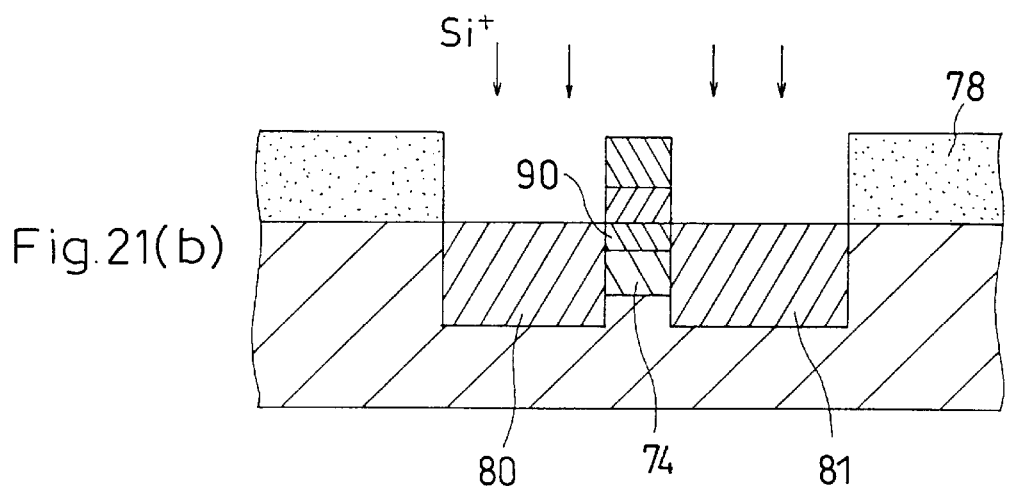
Figure 21C:
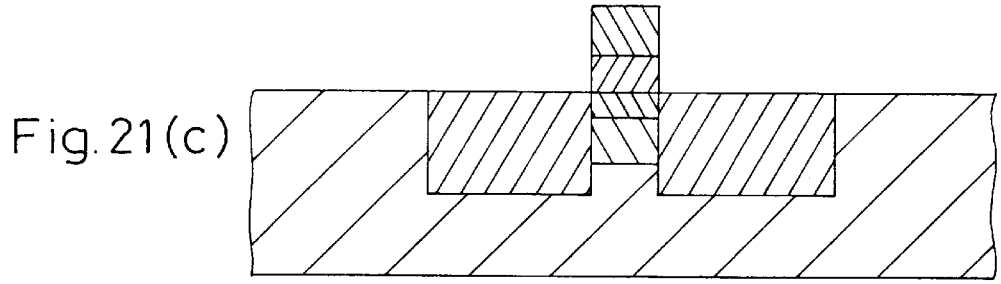
Figure 21D:
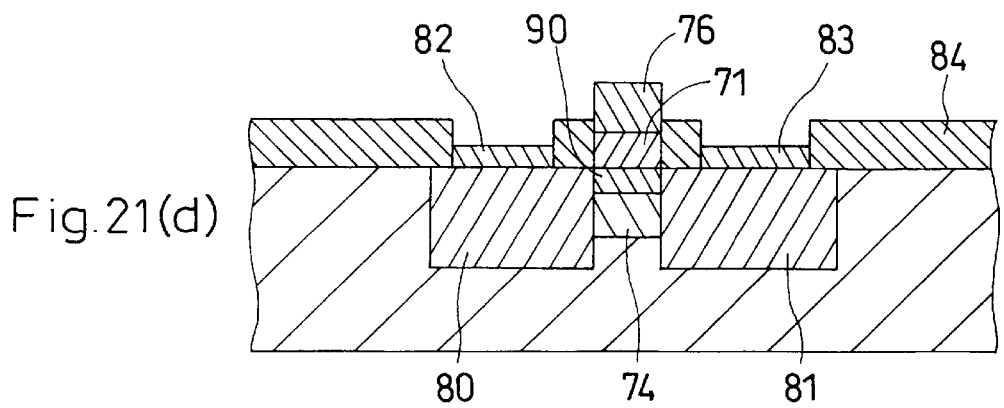

Description will be given on a fifth embodiment, i.e., an example in which the concept of the invention is applied to a pn-junction gate FET (which will be referred to as a JFET hereafter). FIGS. 20((a)–(c)) and FIGS. 21((a)–(d)) are cross sections of a semiconductor device at different steps in a manufacturing process according to the fifth embodiment.

At the steps shown at (a)–(c) in FIG. 20, processing is carried out in a manner similar to that at the steps in the fourth embodiment shown at (a)–(c) in FIG. 17. In this embodiment, however, through-implantation of Mg ions is carried out through the resist mask 73 at the step shown at (b) in FIG. 20, whereby a p-type region 90 shallower than the active layer 74a is formed at a central region of the active layer 74a.

At the subsequent steps shown at (a)–(d) in FIGS. 21, processing is carried out similarly to the steps in the fourth embodiment shown at (a)–(d) in FIG. 18. At the step shown at (c) in FIG. 21, however, annealing is carried out to activate the implanted Si.Mg after removing the resist mask 78.

Through the steps described above, a JFET shown at (d) in FIG. 21 is completed according to the fifth embodiment. In this JFET, there are formed at the semi-insulating GaAs substrate 70 the gate electrode 71, the source and drain regions 80 and 81 made of $n^+$-type regions, the channel region made of a lightly doped n-type region, and the p-type region 90 located immediately above the channel region 74 and immediately under the gate electrode 71.

According to the JEFT having the structure shown at (d) in FIG. 21, the through-implantation of impurity ions improves the performance of the JFET, as is done in the fourth embodiment, and the JEFT can easily have a high uniformity owing to formation of the gate electrode 71 in a self-aligned manner with respect to the p-type region 90 immediately under the same. In particular, since electric charges of the conductivity type opposite to that of the carrier in the channel region 74 exist immediately under the gate electrode 71, generation of piezoelectric charges can be effectively prevented.

Figure 35:
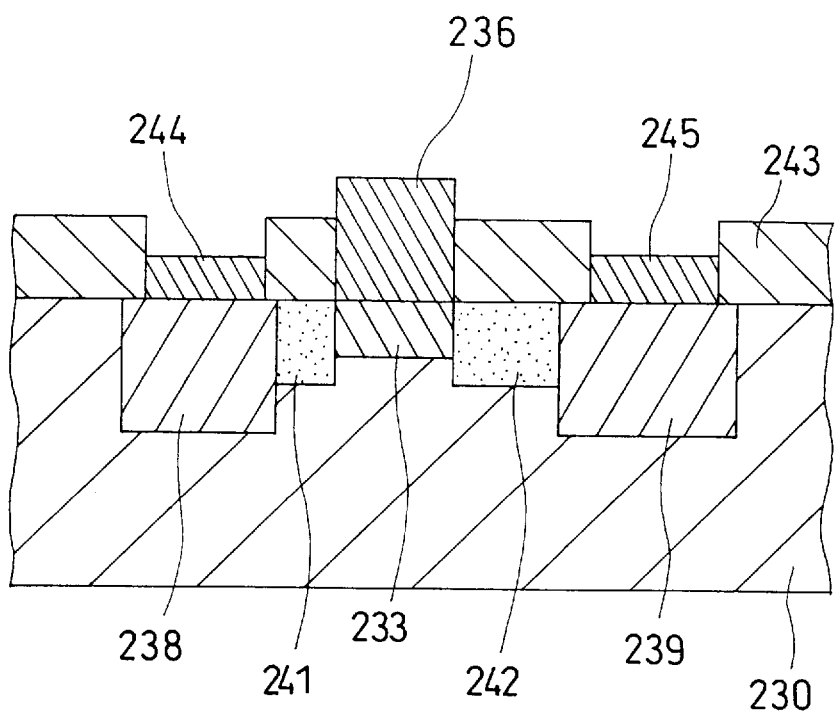
FIG. 35 is a cross section of an FET having a conventional LDD structure.
Figure 36:
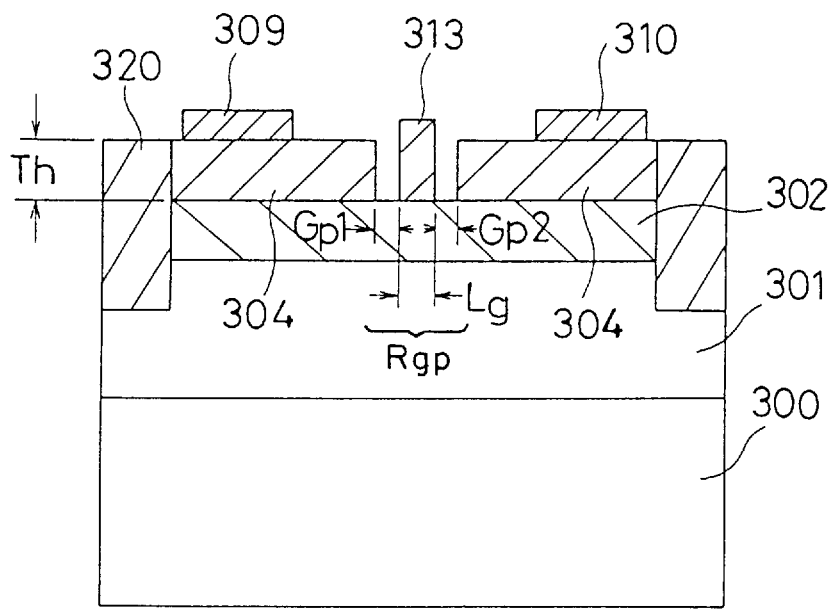
FIG. 36 is a cross section of a conventional high-frequency FET.

Instead of the channel region 233 in the MESFET having the LDD structure shown in FIG. 35, the channel region 74 may be formed by the through-implantation of impurity ions and the p-type region 90 may be formed immediately under the gate electrode 71, as is done in this embodiment, whereby it is also possible to achieve an effect similarly to this embodiment. In this case, the LDD structure can particularly achieve miniaturization of the JFET and improvement of the breakdown voltage property. However, the structure is not restricted to the asymmetrical structure shown in FIG. 35.

The through-implantation, if employed, does not essentially require the use of the WSi film 71a, as is done in this embodiment, and a similar effect can be achieved by the use of another film such as a metal film or an insulating film which has a function of reducing the implantation energy of impurity ions by an appropriate rate.

Although the active layer 74a in the JFET is formed by the ion-implantation of impurity ions in this embodiment, the active layer 74a may be formed by introduction of impurity during the epitaxial crystal growth, in which case the effect can be maintained by formation of the p-type region 90 at a later step.

The description of this embodiment has recited the n-channel JFET in which all the source/drain regions and channel region are made of n-type regions. Naturally, through-implantation of impurity ions and formation of the high resistance layer can achieve an effect similar to that by this embodiment even in a JFET having an active layer formed of a p-layer buried structure and a p-channel JFET.

(Sixth Embodiment)

Figure 22A:
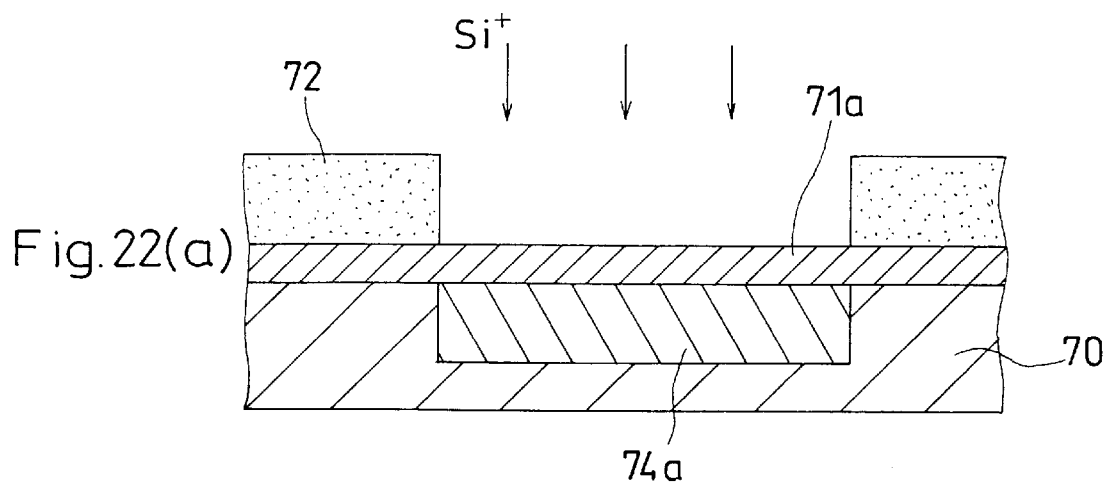
FIG. 22 shows, at (a)–(c), cross sections of a semiconductor structure at steps not later than formation of a p-type region in a manufacturing process of a sixth embodiment.
Figure 22B:
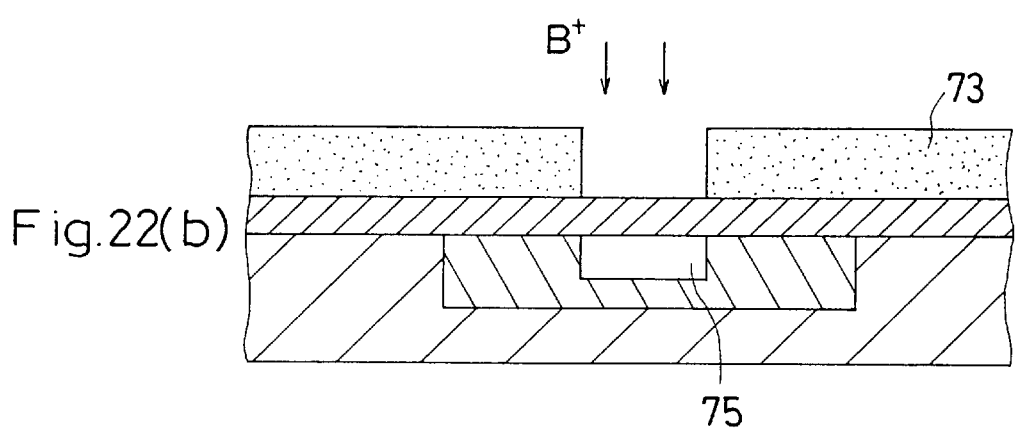
Figure 22C:
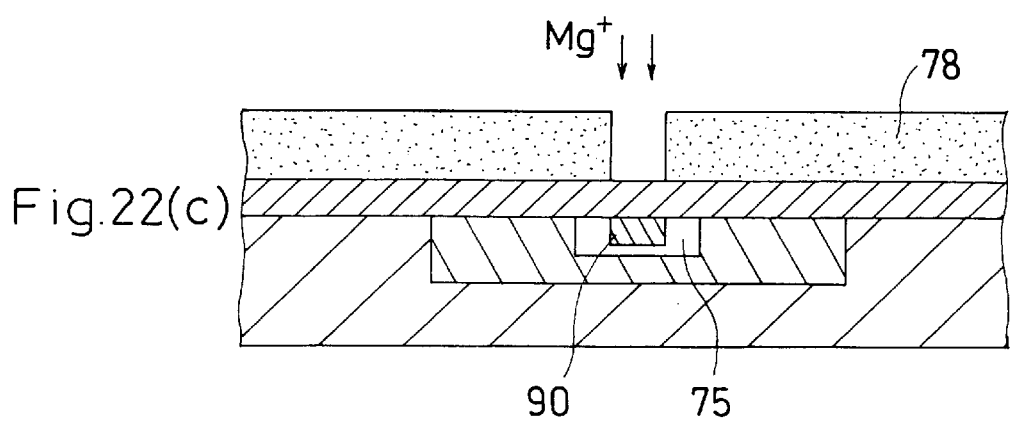

Description will be given on a sixth embodiment, i.e., an example in which the concept of the invention is applied to a pin-junction FET (which will be referred to as a pinFET). FIGS. 22 ((a)–(c)), FIGS. 23((a)–(c)) and FIGS. 24((a) and (b)) are cross sections of a semiconductor device at different steps in a manufacturing process according to this embodiment.

At the steps shown at (a) and (b) in FIG. 22, processing is carried out in a manner similar to that at the steps in the fourth embodiment shown at (a) and (b) in FIG. 17. In this embodiment, however,voltage are implanted with an acceleration voltage of 15 keV using the resist mask 73 to form the high resistance layer 75 deeper and wider than that in the fourth embodiment.

As shown at (c) in FIG. 22, processing is carried out to form the third resist mask 78 having an opening narrower than the opening in the second resist mask 73 shown at (b) in FIG. 22, and Mg ions are implanted with an acceleration voltage of 10 keV using the third resist mask 78 to form the p-type region 90 in the high resistance layer 75. Thus, the high resistance layer 75 shallower than the active layer 74a is formed at a central region of the active layer 74a, and the p-type region 90 shallower than the high resistance layer 75 is formed at the central region of the high resistance layer 75.

Figure 23A:
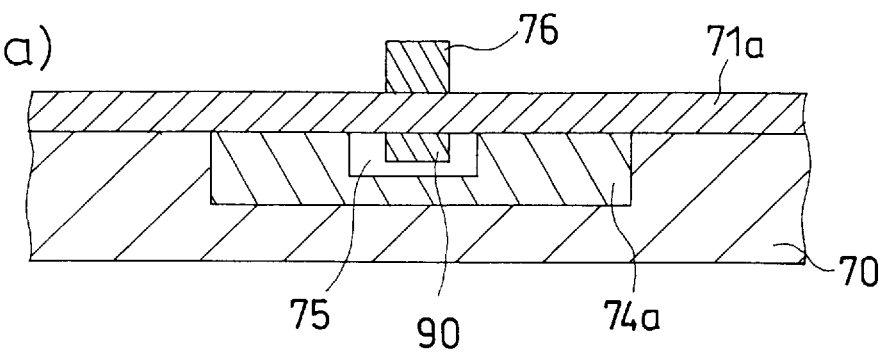
FIG. 23 shows, at (a)–(c), cross sections of a semiconductor structure at steps not later than formation of source/drain regions in a manufacturing process of the sixth embodiment.
Figure 23B:
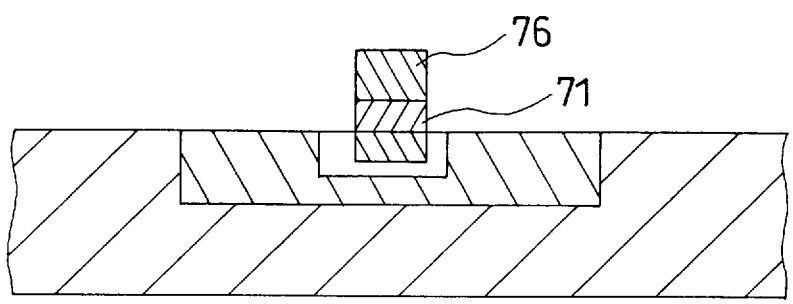
Figure 23C:
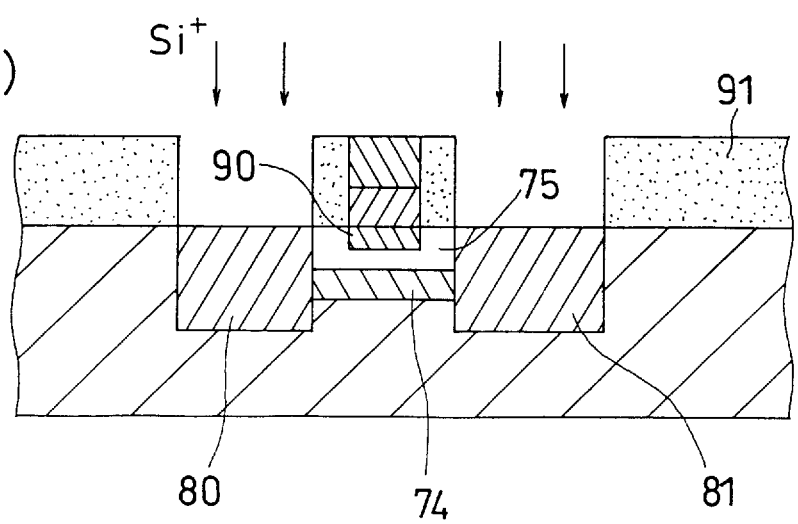

At steps shown at (a)–(c) in FIG. 23, processing is carried out substantially similarly to that at the steps in the fourth embodiment shown at (c) in FIG. 17 and (a) and (b) in FIG. 18, so that the gate electrode 71 made of WSi and the on-gate metal film 76 made of Au are formed immediately above the p-type region 90. Also, the source and drain regions 80 and 81 made of n⁺-type regions are formed at the opposite sides of the high resistance layer 75 (see (c) in FIG. 23). In this embodiment, however, a fourth resist mask 91 used at the step shown at (c) in FIG. 23 additionally covers portions located above the high resistance layer 75 and at the opposite sides of the gate electrode 71 and on-gate metal film 76.

Figure 24A:
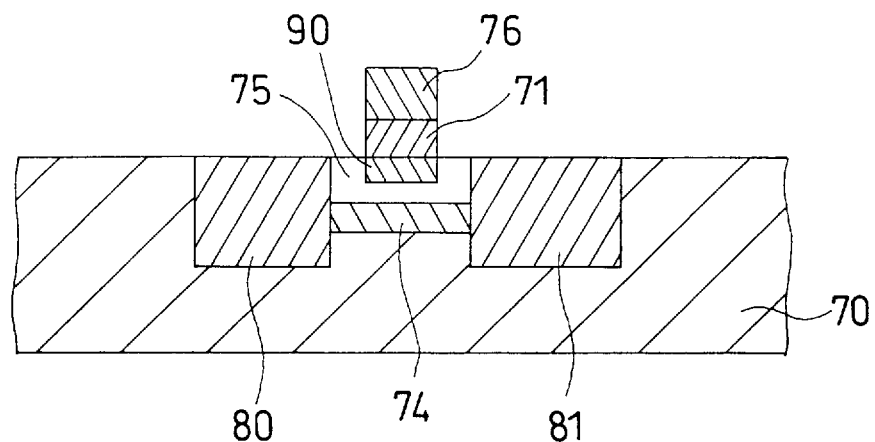
FIG. 24 shows, at (a) and (b), cross sections of a semiconductor structure at steps not later than formation of source and drain electrodes in a manufacturing process of the sixth embodiment.
Figure 24B:
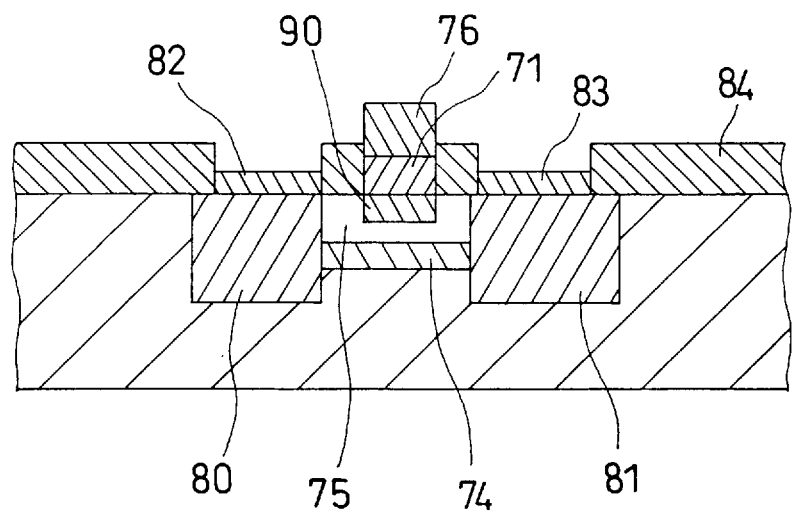
Figure 25A:
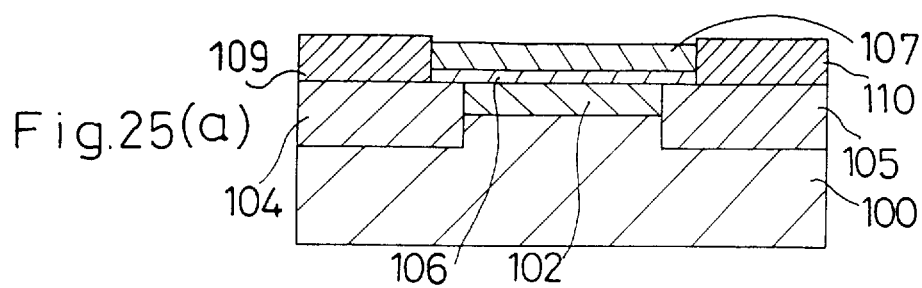
FIG. 25 shows, at (a)–(e), cross sections of a semiconductor structure at different steps in a manufacturing process of a seventh embodiment.
Figure 25B:
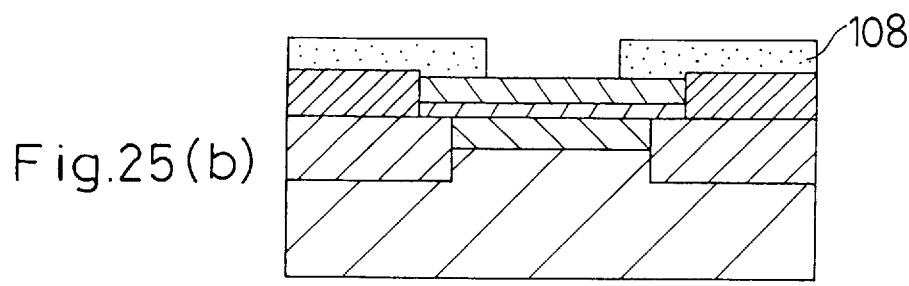
Figure 25C:
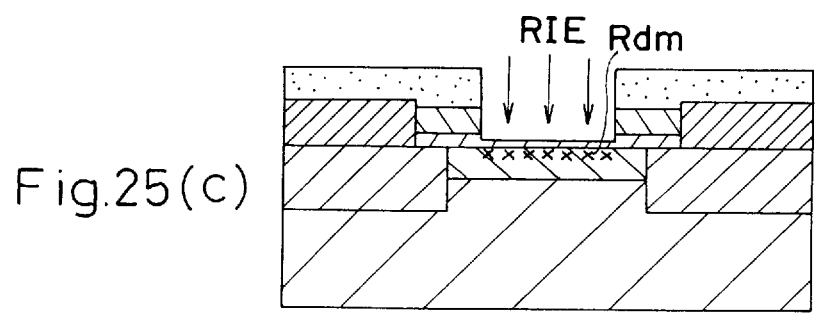
Figure 25D:
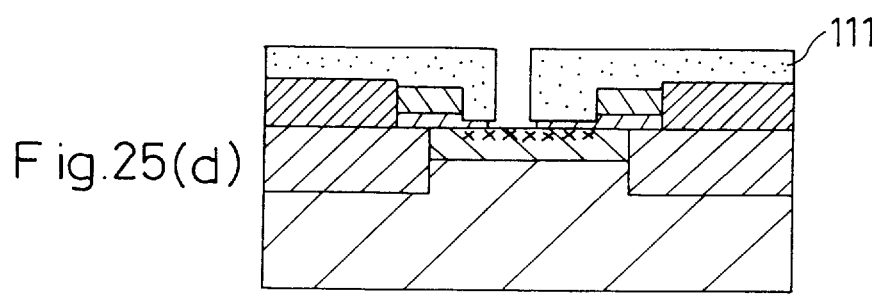
Figure 25E:
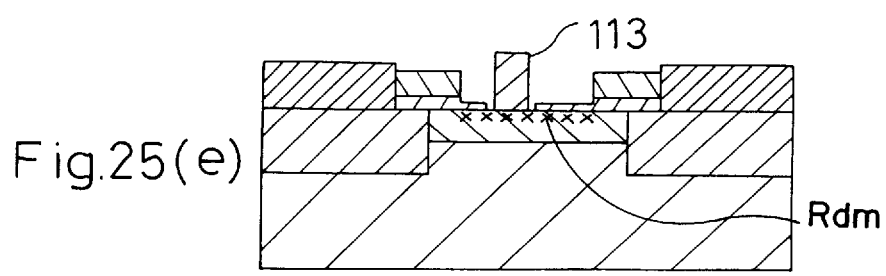
Figure 26A:
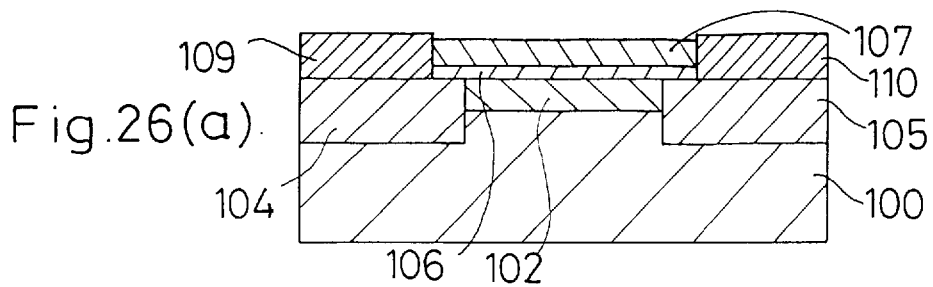
FIG. 26 shows, at (a)–(e), cross sections of a semiconductor structure at different steps in a manufacturing process of an eighth embodiment.
Figure 26B:
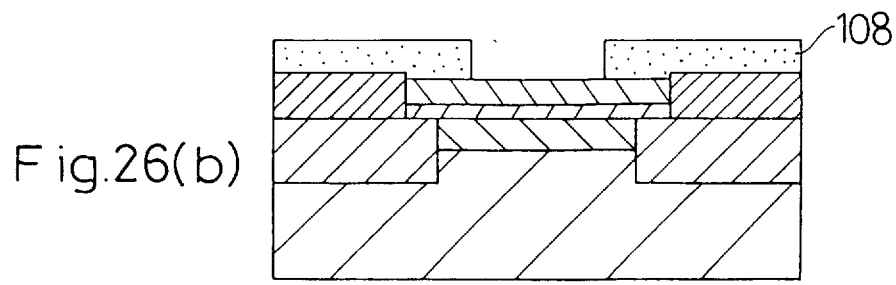
Figure 26C:
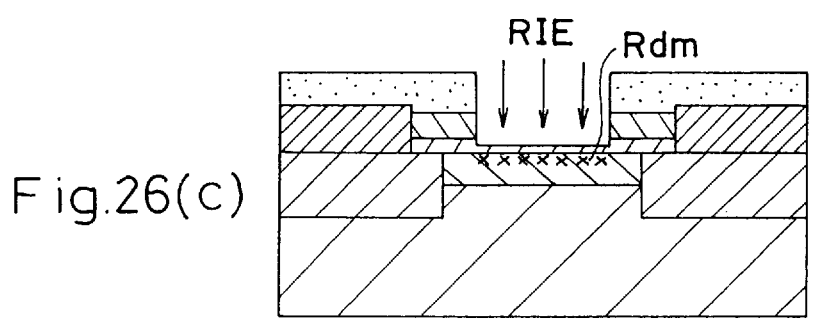
Figure 26D:
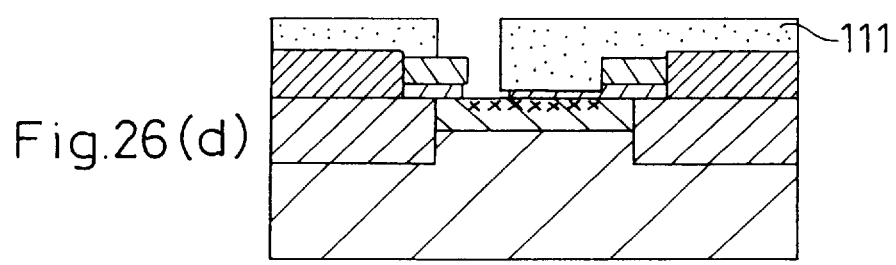
Figure 26E:
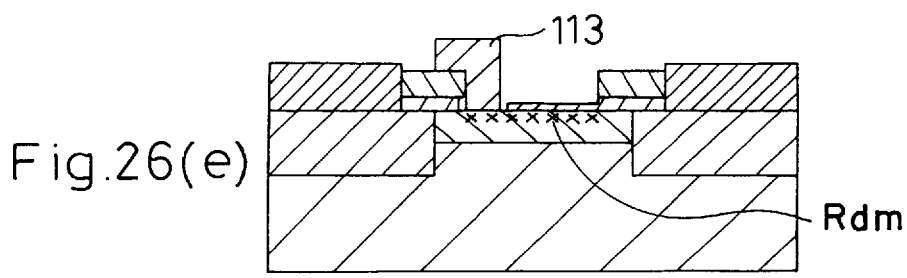
Figure 28A:
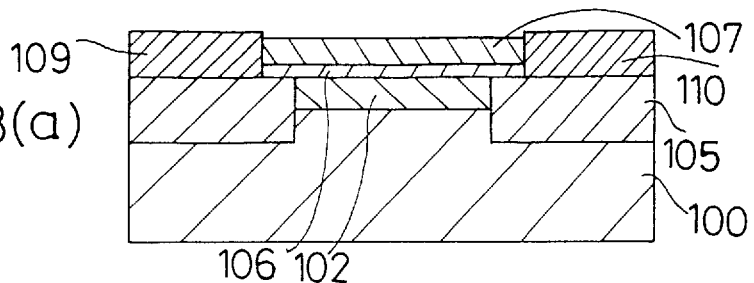
FIG. 28 shows, at (a)–(e), cross sections of a semiconductor structure at different steps in a manufacturing process of a tenth embodiment.
Figure 28B:
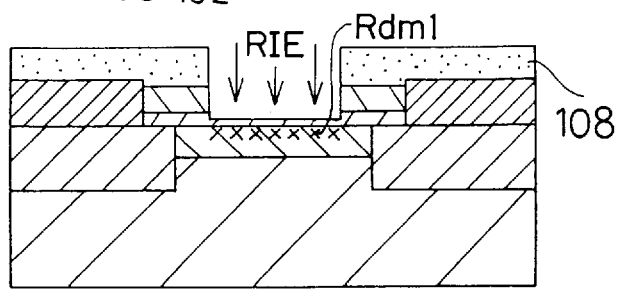
Figure 28C:
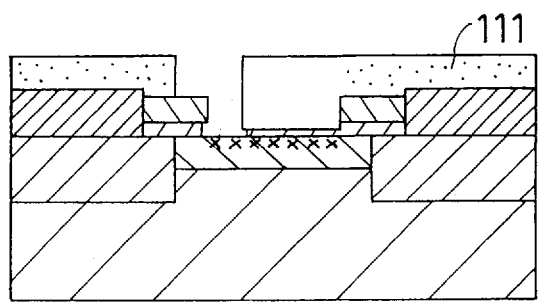
Figure 28D:
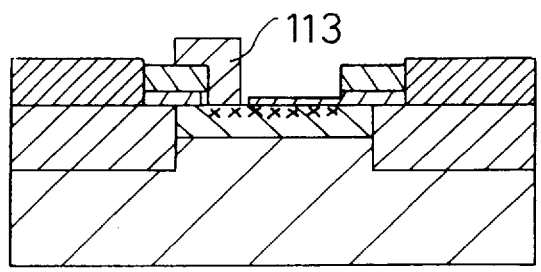
Figure 28E:
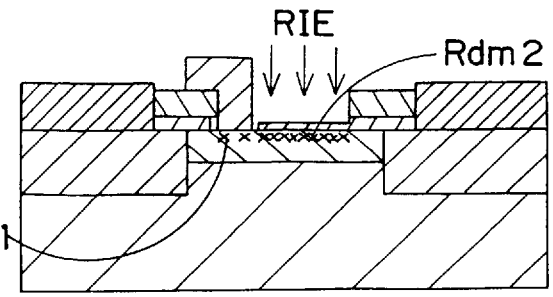
Figure 29A:
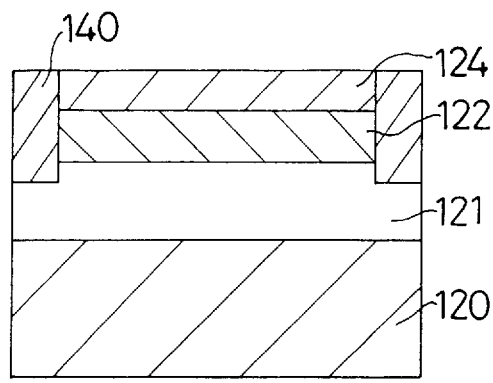
FIG. 29 shows, at (a)–(f), cross sections of a semiconductor structure at different steps in a manufacturing process of an eleventh embodiment.
Figure 29D:
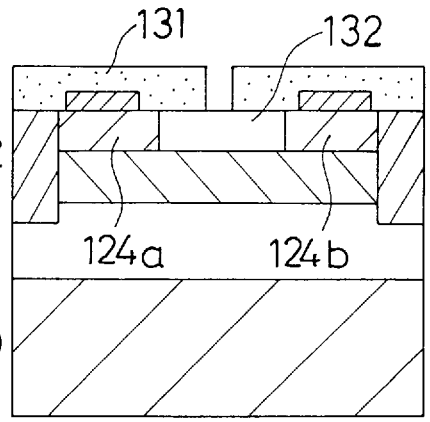
Figure 29B:
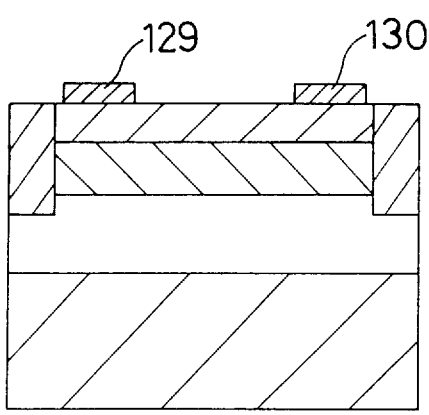
Figure 29E:
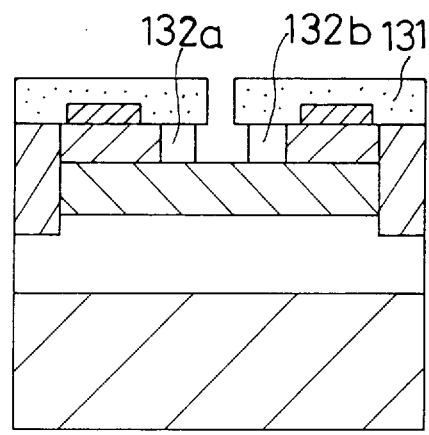
Figure 29C:
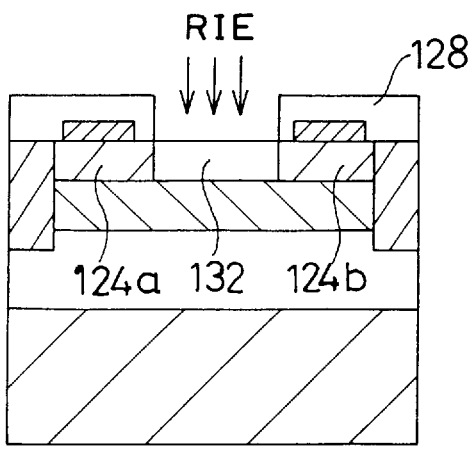
Figure 29F:
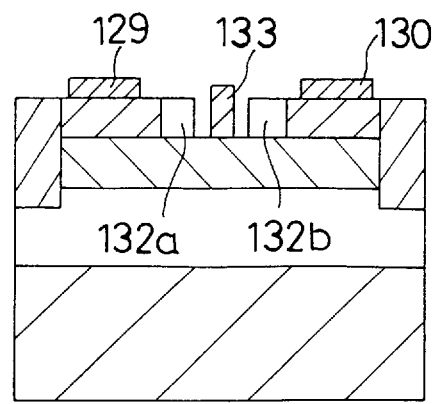
Figure 30A:
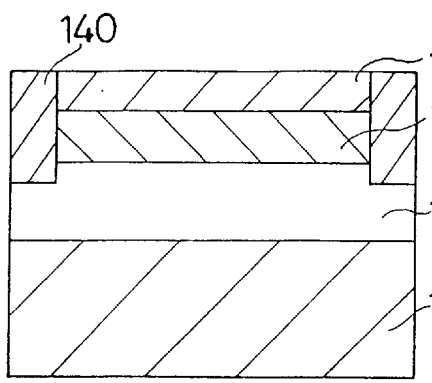
FIG. 30 shows, at (a)–(f), cross sections of a semiconductor structure at different steps in a manufacturing process of a modification of the eleventh embodiment.
Figure 30D:
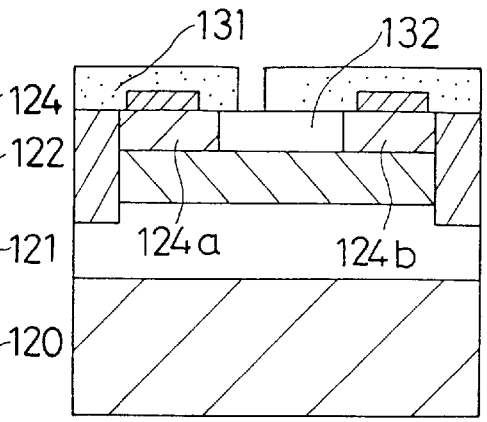
Figure 30B:
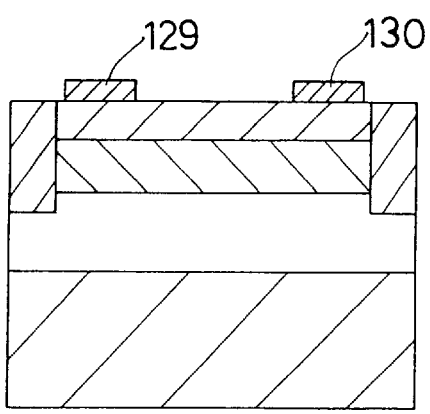
Figure 30E:
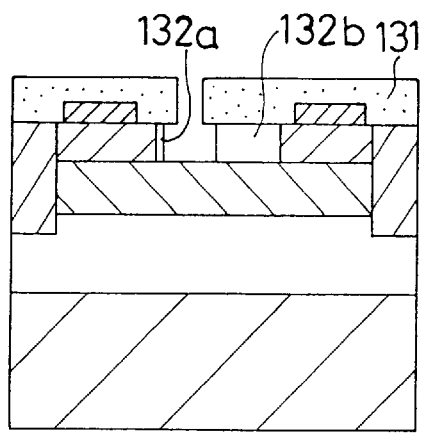
Figure 30C:
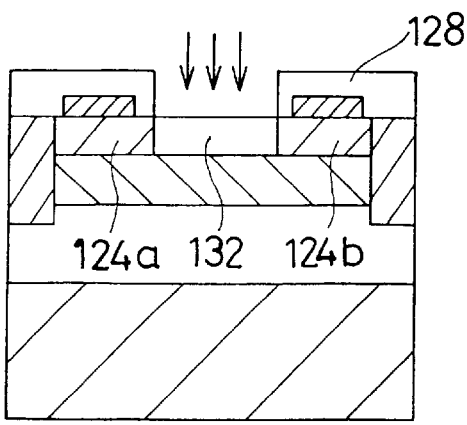
Figure 30F:
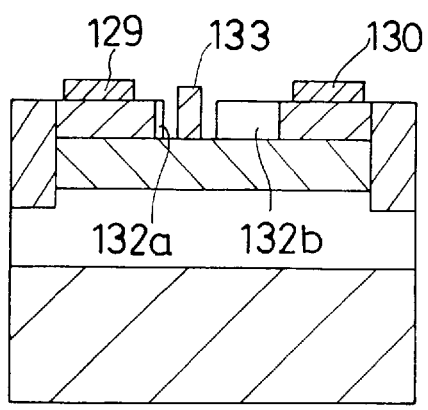

At subsequent steps shown at (a) and (b) in FIG. 24, processing is carried out similarly to the steps in the fourth embodiment shown at (c) and (d) in FIG. 18. More specifically, Si.Mg implanted into the semi-insulating GaAs substrate 70 is activated to form the source and drain electrodes 82 and 83 immediately above the source and drain regions 80 and 81, respectively. In this manner, the pinFET is completed.

According to the pinFET shown at (c) in FIG. 24, the pinFET can have an improved performance owing to the through-implantation of impurity ions similarly to the fourth and fifth embodiments. Also, the FET can be designed with a high degree of freedom because the width and depth of the i-layer (high resistance layer 75) can be freely determined.

Instead of the channel region 233 in the MESFET having the LDD structure shown in FIG. 35, it may be possible to form the channel region 74 by the through-implantation of impurity ions aw well as the high resistance layer 75 and the p-type region 90 immediately under the gate electrode 71, as is done in this embodiment, whereby it is also possible to achieve an effect similarly to this embodiment. In this case, the LDD structure can particularly achieve miniaturization of the pinFET and improvement of the breakdown voltage property. However, the structure is not restricted to the asymmetrical structure shown in FIG. 35.

The through-implantation, if employed, does not essentially require the use of the WSi film 71a, as is done in this embodiment, and a similar effect can be achieved by the use of another film such as a metal film or an insulating film which has a function of reducing the implantation energy of impurity ions by an appropriate rate.

Although the active layer 74a in the pinFET is formed by the ion-implantation of impurity ions in this embodiment, the active layer 74a may be formed by introduction of impurity during the epitaxial crystal growth, in which case the effect can be maintained by formation of the p-type region 90 at a later step.

The description of this embodiment has recited the n-channel pinFET in which all the source/drain regions and channel region are made of n-type regions. Naturally, through-implantation of impurity ions and formation of the high resistance layer can achieve an effect similar to that by this embodiment even in a pinFET having an active layer formed of a p-layer buried structure and a p-channel pinFET.

In this embodiment, processing at the step shown at (c) in FIG. 23 uses the resist mask which covers not only the region of the semi-insulating GaAs substrate 70 except for the active layer 74a but also the portion thereof located at the opposite sides of the gate electrode 71 and on-gate metal film 76 and above the high resistance layer 75. Alternatively, side walls may be formed at the opposite sides of the gate electrode 71 and on-gate metal film 76 by anisotropic etching carried out after deposition of the silicon nitride film and others. Also in this case, the width of the high resistance layer 75 can be controlled to some extent by changing the thickness of the deposited silicon nitride film, and inner edges of the source and drain regions 80 and 81 can be defined in a self-aligned manner with respect to the gate electrode 71.

Instead of the second resist mask 73 shown at (b) in FIG. 22, the processing may use the first resist mask 72 already used at the step shown at (a) in FIG. 22, as it is. In this case, the high resistance layer 75 fully occupies an area immediately above the active layer 74a at an initial stage, and will be reduced in size by implantation of impurity ions carried out for forming the source and drain regions 80 and 81.

Although not shown in the figure, an n-type region may be formed in place of the p-type region 90 in the sixth embodiment, whereby an FET having a large drive power can be easily produced by appropriately controlling a distance between the n-type region and the channel region below the same while maintaining a high breakdown voltage by existence of the high resistance layer between the n-type region and the drain laterally spaced therefrom.

(Seventh Embodiment)

Description will be given on a seventh embodiment, i.e., an example in which the concept of the invention is applied to an MESFET having a damage layer wider than the gate length. FIG. 25 shows, at (a)–(e), cross sections of a semiconductor device at different steps in a manufacturing process according to the seventh embodiment.

As shown at (a) in FIG. 25, processing is carried out to form on a portion of a semi-insulating GaAs substrate 100 an active layer 102, a source region 104, a drain region 105, a silicon oxide film 106, a silicon nitride film 107, a source electrode 109 and a drain electrode 110. Since steps preceding the step shown at (a) in FIG. 25 can be readily understood from the embodiments already described, they are neither shown in the drawings nor described.

As shown at (b) in FIG. 25, processing is carried out to form a first resist mask 108 having an opening located only above a portion (i.e., portion except for opposite ends) of the active layer 102 by photolithography. This opening contains a gate formation region.

As shown at (c) in FIG. 25, dry etching (i.e., RIE) is effected on the silicon nitride film 107 and silicon oxide film 106. In this embodiment, the silicon oxide film 106 originally had a thickness of about 50 nm, and has a thickness from several angstroms to about 20 nm after the dry etching. Similarly to the first embodiment, the dry etching forms a damage layer Rdm at a portion of the active layer 102 located near its surface and under the opening of the first resist mask 108.

As shown at (d) in FIG. 25, after removing the first resist mask 108, a second resist mask 111 having an opening at the gate electrode formation region is formed. Wet etching is effected on the above structure with an HF solution to remove the silicon oxide film 106 from the gate electrode formation region. Thereafter, the GaAs substrate 100 at the gate electrode formation region is etched with a tartaric acid solution to form a recess structure. At this step, a portion of the damage layer Rdm in the active layer 102 extremely near its surface is removed, but the damage layer Rdm remains at the surface region of the active layer 102.

As shown at (e) in FIG. 25, after depositing a metal layer which will form a gate electrode, lift-off is effected on the metal layer to form the gate electrode 113.

A major point of this embodiment is that, at the state shown at (e) in FIG. 25, the damage layer Rdm (low carrier concentration layer) formed at the surface region of the active layer 102 occupies a large surface region which is not restricted to an area immediately under the gate electrode 113 but is extended beyond the same. Since the MESFET formed in this embodiment includes the damage layer Rdm formed at the surface region between the gate electrode 113 and particularly the drain region, it can exhibit a further improved gate/drain breakdown voltage BVgd.

(Eighth Embodiment)

Description will be given on an eighth embodiment, i.e., an example in which the concept of the invention is applied to an offset-type MESFET. FIG. 26 shows, at (a)–(e), cross sections of a semiconductor device at different steps in a manufacturing process according to the eighth embodiment.

At the steps shown at (a)–(c) in FIG. 26, processing is carried out in a manner similar to that at the steps in the seventh embodiment shown at (a)–(c) in FIG. 25.

Also in this embodiment, the silicon oxide film 106 originally had a thickness of about 50 nm, and the dry-etched silicon oxide film 106 has a thickness from several angstroms to about 20 nm. The damage layer Rdm is formed at a portion of the active layer 102 located near its surface and under the opening of the first resist mask 108.

As shown at (d) in FIG. 26, after removing the first resist mask 108, the second resist mask 111 having an opening at the gate electrode formation region is formed. In this state, the opening in the second resist mask 111 is offset toward the source region 104 to cover a portion of the active layer 102 remote from the drain region 105 and a portion of the silicon nitride film 107 above the source region 104. Wet etching is effected on the above structure with an HF solution to remove the silicon oxide film 106 from the gate electrode formation region. Thereafter, the GaAs substrate 100 at the gate electrode formation region is etched with a tartaric acid solution to form a recess structure. At this step, a portion of the damage layer Rdm in the active layer 102 is partially removed, but the damage layer Rdm of a low carrier concentration remains near the surface of the active layer 102.

As shown at (e) in FIG. 26, after depositing a metal layer which will form a gate electrode, lift-off is effected on the metal layer to form the gate electrode 113. As a result, a portion of the gate electrode 113 near the source region 104 is formed in a self-aligned manner with respect to the end of the opening in the silicon nitride film 107. In other words, the gate electrode 113 is formed above an end portion of the damage layer Rdm near the source.

A major point of this embodiment is that, at the state shown at (e) in FIG. 26, the damage layer Rdm (low carrier concentration layer) is formed at the active layer 102 immediately under the gate electrode 113, and the gate electrode 113 is formed in the self-aligned manner with respect to the ends of the openings in the first and second insulating films 106 and 107 to form the offset structure. Since the MESFET formed in this embodiment includes the damage layer Rdm, it has an advantage similar to that of the seventh embodiment. Also the offset gate structure can exhibit a remarkably low source resistance and a remarkably high gate/drain breakdown voltage BVgd.

(Ninth Embodiment)

Description will be given on a ninth embodiment, i.e., an example in which the concept of the invention is applied to an MESFET having two kinds of low carrier concentration layers. FIG. 27 shows, at (a)–(e), cross sections of a semiconductor device at different steps in a manufacturing process according to the ninth embodiment.

At the steps shown at (a) and (b) in FIG. 27, processing is carried out in a manner similar to that at the steps in the seventh embodiment shown at (a)–(b) in FIG. 25, although the structure at the step corresponding to the step at (b) in FIG. 25 is not shown.

In this embodiment, a first damage layer Rdm1 is formed at a region under the opening in the first resist mask 108 and near the surface of the active layer 102.

As shown at (c) in FIG. 27, after removing the first resist mask 108, the second resist mask 111 having an opening at the gate electrode formation region is formed. Wet etching is effected on the above structure with an HF solution to remove the silicon oxide film 106 from the gate electrode formation region. Thereafter, the GaAs substrate 100 at the gate electrode formation region is etched with a tartaric acid solution to form a recess structure. At this step, a portion of the first damage layer Rdm1 extremely near its surface is removed, but the first damage layer Rdm1 remains at the surface region of the active layer 102.

As shown at (d) in FIG. 27, after depositing a metal film which will form a gate electrode, lift-off is effected on the metal layer to form the gate electrode 113.

As shown at (e) in FIG. 27, dry etching (i.e., RIE) is effected on a portion of the silicon oxide film 106 having an exposed surface. However, this dry etching is effected to such an extent that the silicon oxide film 106 is not entirely removed but only the upper layer portion is removed. This step further reduces the carrier concentration at a portion of the first damage layer Rdm1, which was formed at the step shown at (b) in FIG. 27, except for the region immediately under the gate electrode 113, so that a second damage layer Rdm2 of an extremely low carrier concentration is formed.

A major point of this embodiment is that, at the state shown at (e) in FIG. 27, the first damage layer Rdm1 (first low carrier concentration layer) is formed at the active layer 102 immediately under the gate electrode 113, and that the second damage layer Rdm2 (second low carrier concentration layer) is formed at the portions of the active layer 102 located at the opposite sides of the gate electrode 113. Since the MESFET formed in this embodiment includes the first damage layer Rdm1, it has an advantage similar to that of the first and seventh embodiments. Also the second damage layer Rdm2 of an extremely low carrier concentration suppresses the electric field at the active layer 102. Therefore, the MESFET can have a remarkably improved gate/drain breakdown voltage BVgd.

(Tenth Embodiment)

Description will be given on a tenth embodiment, i.e., an example in which the concept of the invention is applied to a second offset type MESFET having two kinds of low carrier concentration layers. FIG. 28 shows, at (a)–(e), cross sections of a semiconductor device at different steps in a manufacturing process according to the tenth embodiment.

At the steps-shown at (a) and (b) in FIG. 28, processing is carried out in a manner similar to that at the steps in the eighth embodiment shown at (a)–(c) in FIG. 26, although the structure at the step corresponding to the step at (b) in FIG. 26 is not shown.

In this embodiment, the dry-etched silicon oxide film 106 shown at (b) in FIG. 28 has a thickness from several angstroms to about 20 nm. The first damage layer Rdm1 is formed at a portion of the active layer 102 located near its surface and under the opening of the first resist mask 108.

As shown at (c) in FIG. 28, after removing the first resist mask 108, the second resist mask 111 having an opening at the gate electrode formation region is formed. In this state, the opening in the second resist mask 111 is offset toward the source region 104 to cover a portion of the active layer 102 remote from the drain region 105 and a portion of the silicon nitride film 107 above the source region 104. Wet etching is effected on the above structure with an HF solution to remove the silicon oxide film 106 from the gate electrode formation region. Thereafter, the GaAs substrate 100 at the gate electrode formation region is etched with a tartaric acid solution to form a recess structure. At this step, a portion of the first damage layer Rdm1 in the active layer 102 is partially removed, but the first damage layer Rdm1 remains at the surface region of the active layer 102.

As shown at (d) in FIG. 28, after depositing a metal layer which will form a gate electrode, lift-off is effected on the metal layer to form the gate electrode 113. As a result, the gate electrode 113 has a portion near the source region 104 which is formed in a self-aligned manner with respect to the end of the opening in the silicon nitride film 107. In other words, the gate electrode 113 is formed above an end portion of the first damage layer Rdm1 near the source.

As shown at (e) in FIG. 28, dry etching (i.e., RIE) is effected on a portion of the silicon oxide film 106 having an exposed surface. However, this dry etching is effected to such an extent that the silicon oxide film 106 is not entirely removed but only the upper layer portion is removed. This step further reduces the carrier concentration at a portion of the first damage layer Rdm1, which was formed at the step shown at (b) in FIG. 28, except for the region immediately under the gate electrode 113, so that the second damage layer Rdm2 of an extremely low carrier concentration is formed.

A major point of this embodiment is that, at the state shown at (e) in FIG. 28, the first damage layer Rdm1 (first low carrier concentration layer) is formed at the surface region of the active layer 102 wider than the gate electrode 113, that the gate electrode 113 is formed at the region above the end of the active layer 102 near the source and particularly is formed in the self-aligned manner with respect to the ends of the openings in the first and second insulating films to form the offset structure, and that the second damage layer Rdm2 (second low carrier concentration layer) is formed at the portion of the active layer 102 located at one side of the gate electrode 113. The MESFET formed in this embodiment has an advantage similar to that of the first and seventh embodiments. Also the second damage layer Rdm2 of an extremely low carrier concentration suppresses the electric field at the active layer 102. Therefore, the MESFET can have a remarkably improved gate/drain breakdown voltage BVgd.

In the first to tenth embodiments already described, it is preferable that the low carrier concentration layer has a depth in a range from about 20 to about 50 nm, the channel portion of the active layer except for the low carrier concentration layer has a thickness in a range from about 80 to about 150 nm, and the carrier concentration at the active layer is in a range from about $1 \times 10^{17}$ to about $3 \times 10^{17}$ cm$^{-3}$. The carrier concentration at the low carrier concentration layer is preferably not higher than $10^{16}$ cm$^{-3}$, and is more preferably in a range from $5 \times 10^{14}$ to $5 \times 10^{15}$ cm$^{-3}$.

(Eleventh Embodiment)

Description will be given on an eleventh embodiment, i.e., an example in which the concept of the invention is applied to a high-frequency FET. FIG. 29 shows, at (a)–(f), cross sections of a semiconductor device at different steps in a manufacturing process according to the eleventh embodiment, and FIG. 30 shows, at (a)–(f), cross sections of a semiconductor device at different steps in a manufacturing process according to a modification of the eleventh embodiment. This embodiment will be described below in connection with a process of manufacturing a high-frequency GaAs FET having a gate length of 0.1 μm.

As shown at (a) in FIG. 29, a buffer layer 121 made of undoped GaAs, a channel layer 122 made of n-type GaAs, and a low-resistance semiconductor layer 124 made of GaAs heavily doped with impurity and provided for reducing a contact resistance of an ohmic electrode are successively layered on a semi-insulating GaAs substrate 120, e.g., by a molecular beam epitaxy method. The semiconductor layer 124 has a thickness of, e.g., from 50 to 100 nm and an impurity concentration not lower than $1 \times 10^{18}$ cm$^{-3}$.

Boron (B$^+$) ions are implanted into a region except for the FET formation region to supply the ions to the semiconductor layer 124, the channel layer 122 and a portion of the buffer 121, so that an isolation region 140 is formed.

As shown at (b) in FIG. 29, an AuGe.Ni.Au film is vapor-deposited on the semiconductor layer 124 and is sintered for forming alloy. Then, it is patterned to from source and drain electrodes 129 and 130.

As shown at (c) in FIG. 29, the source and drain electrodes 129 and 130 are covered with a first resist mask 128 having an opening partially exposing a portion of the semiconductor layer 124 between the electrodes 129 and 130. The width of the opening in the first resist mask 128 is about 0.5 μm. Using the first resist mask 128, RIE is effected to irradiate CF$_4$, O$_2$ or the like to the semiconductor layer 124 through the opening in the first resist mask 128 to reduce the carrier concentration for changing this portion into an insulator. At this step, the semiconductor layer 124 is divided into two contact layers 124a and 124b, between which an insulator layer 132 which is a low carrier concentration layer is formed. Although the insulator layer 132 initially had a carrier concentration of about $5 \times 10^{16}$ cm$^{-3}$, it is desired to change it into a complete insulator having a carrier concentration lower than about $10^4$ cm$^{-3}$.

A portion of the semiconductor layer 124 between the source and drain electrodes may be entirely changed into the insulator. In this case, a plasma is irradiated to the semiconductor layer 124 using the source and drain electrodes 129 and 130 as a mask without forming the first resist mask 128. The plasma species is not restricted to CF$_4$ and O$_2$. Further, the semiconductor layer 124 may be changed into the insulator by ion implantation of, e.g., boron, oxygen or hydrogen instead of the plasma irradiation.

In the process of changing the semiconductor layer 124 into the insulator (i.e., providing the semiconductor layer 124 with the insulating property), it is not necessary to change the entire thickness of the semiconductor layer into the insulator, and only an upper portion of the semiconductor layer 124 may be changed into the insulator. In this case, by monitoring a current between the source and drain electrodes, it is possible to control the depth of the semiconductor layer 124 changed into the insulator.

As shown at (d) in FIG. 29, a second resist mask 131 having an opening exposing the gate electrode formation region is formed on the source electrode 129, drain electrode 130 and insulator layer 132. The width of the opening in this second resist mask 130 is 0.1 μm.

For the purpose of adjusting the threshold voltage of FT, as shown at (e) in FIG. 29, recess etching using the second resist mask 131 is effected to remove partially the insulator layer 132 and the channel layer 122 under the same with etchant such as $H_3PO_4:H_2O_2:H_2O$ at the opening in the second resist mask 131. Thereby, the insulator layer 132 is divided into two, i.e., first and second insulator layers 132a and 132b.

As shown at (f) in FIG. 29, after surface treatment, a metal film for the gate electrode is deposited on the structure including the second resist mask 131, and lift-off is carried out to form the gate electrode 133. For example, a Ti.Pt.Au film may be used for formation of the gate electrode 133.

Figure 31:
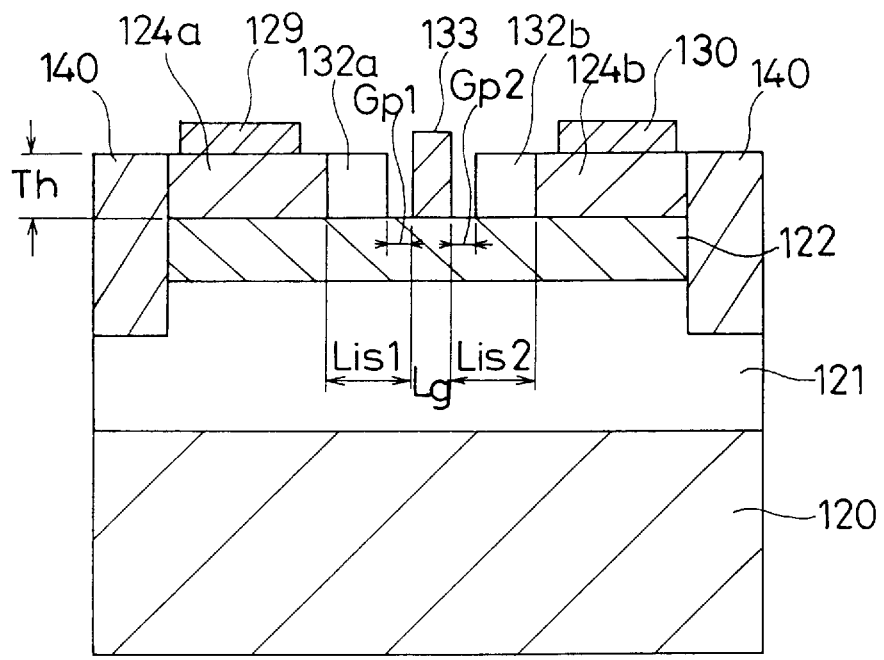
FIG. 31 is a cross section showing a structure of an FET of the eleventh embodiment.
Figure 32A:
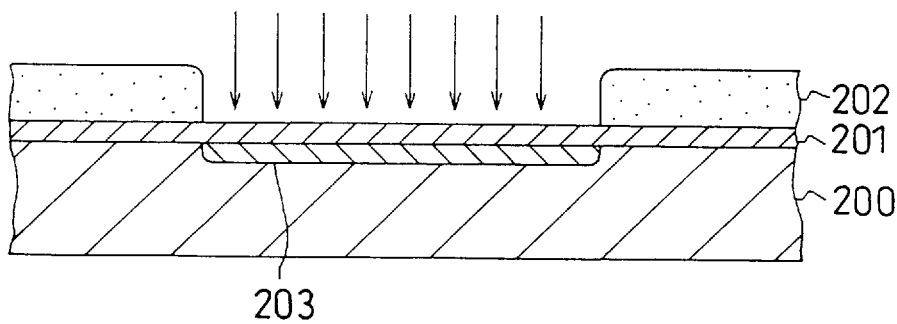
FIG. 32 shows, at (a)–(c), cross sections of a semiconductor structure at steps not later than deposition of first and second insulating films in a first conventional method of manufacturing an FET.
Figure 32B:
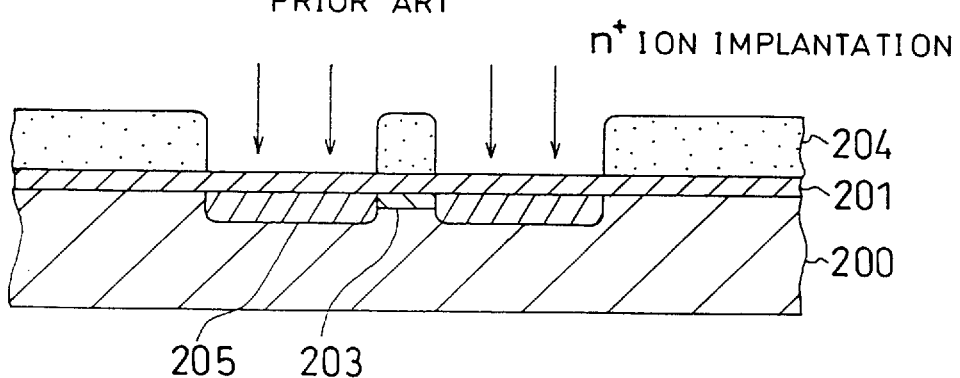
Figure 32C:
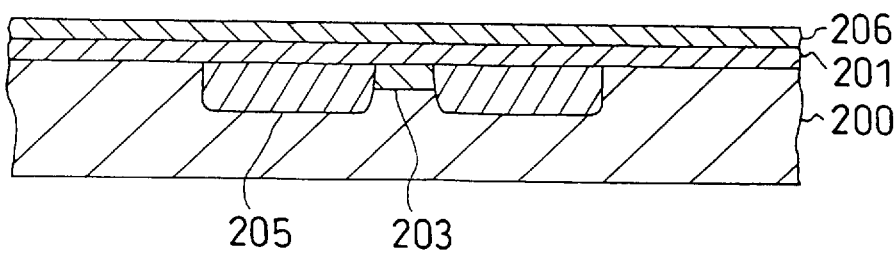
Figure 33A:
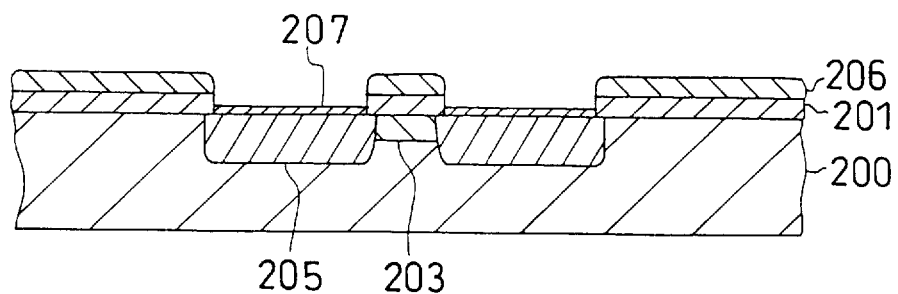
FIG. 33 shows, at (a)–(c), cross sections of a semiconductor structure at steps not later than formation of interconnections in the first conventional method of manufacturing the FET.
Figure 33B:
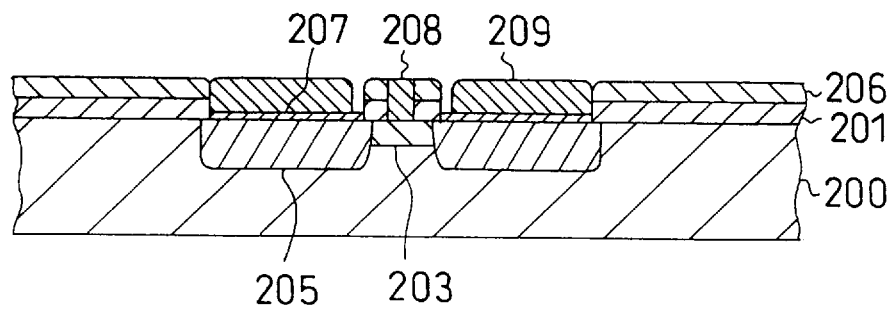
Figure 33C:
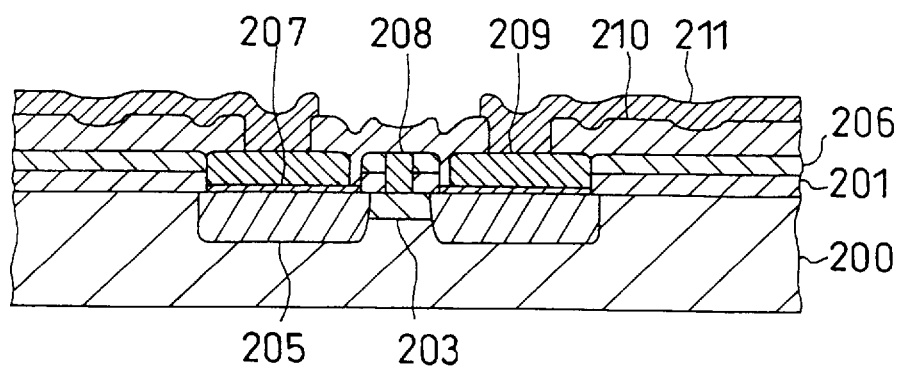
Figure 34:
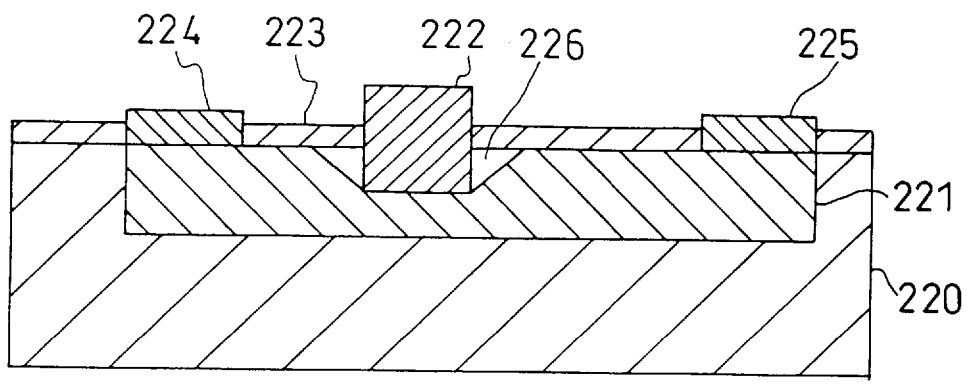
FIG. 34 is a cross section of an FET produced by a second conventional manufacturing method.

FIG. 31 is a cross section showing a structure of the FET formed through the steps at (a)–(f) in FIG. 29. The contact layers 124a and 124b each have a thickness Th of about 50 nm. A gate length Lg is 0.1 μm. Spaces Gp1 and Gp2 between the gate electrode 133 and the insulator layers 132a and 132b each are 50 nm. Distances Lis1 and Lis2 between the gate electrode 133 and the contact layers 124a and 124b each are 0.2 μm.

At steps shown at (a)–(f) in FIG. 29, the gate electrode 133 is formed at a substantially middle position between the source and drain electrodes 129 and 130. Alternatively, the gate electrode 133 may be offset toward the source electrode 129 as shown at (a)–(f) in FIG. 30. In this case, at the state shown at (f) in FIG. 30, the contact layers 124a and 124b each have a thickness Th of about 50 nm. A gate length Lg is 0.1 μm. Spaces Gp1 and Gp2 between the gate electrode 133 and the insulator layers 132a and 132b each are 50 nm. Distances Lis1 and Lis2 between the gate electrode 133 and the contact layers 124a and 124b are 0.1 μm and 0.2–03. μm, respectively. A smaller distance between the gate electrode 133 and the contact layer 124a at the source side is more preferable.

According to this embodiment, the semiconductor layer 124 is partially changed into the insulator to form the first and second insulating layers 132a and 132b, which results in the structure that a carrier does not exist between the gate electrode 133 and the drain electrode 130 and the second insulator layer 132b exists therebetween. Therefore, the gate/drain capacity Cgd decreases, and the maximum oscillation frequency fmax is improved. Meanwhile, as a result of formation of the insulator layer 132b at the side of the gate electrode 133, the contact layer 124b heavily doped with $n^+$-GaAs is remote from the gate electrode 133, which improves the breakdown voltage. Since dry process is utilized for changing the semiconductor layer 124 into the insulator, the thickness of the portion for forming the insulator can be determined with good controllability. At the recess etching shown at (e) in FIG. 29 and at (e) in FIG. 30, the etching in the lateral direction is effected on the insulator layers 132a and 132b, so that, even if there is a difference between the lengths of laterally removed portions, the distances between the gate and drain and between the gate and source are maintained at constant values in contrast to the convention FET already described. Therefore, it is possible to suppress the influence on the breakdown property of the FET by variation in the lengths of the laterally removed portions, and the high breakdown voltage can be maintained. By the above reasons, the high-frequency properties can be improved.

Figure 37:
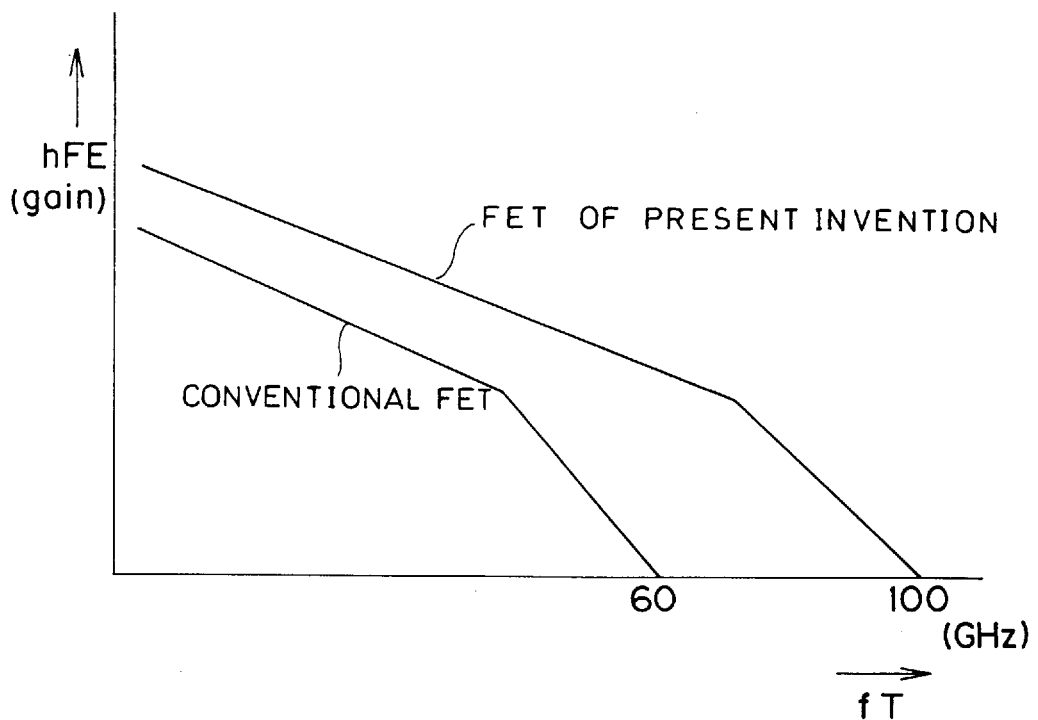
FIG. 37 is a graph showing power gains and maximum cut-off frequency properties of the FET of the eleventh embodiment and the conventional FET for comparison.

FIG. 37 shows high-frequency properties of the high-frequency GaAs FET of the invention and the conventional high-frequency GaAs FET for comparison. As shown in FIG. 37, the high-frequency GaAs FET of the invention can improve both the current amplifying factor hFE and the maximum cut-off frequency fT.

In this embodiment, the contact layers 124a and 124 made of the low-resistant semiconductor layers are disposed between the source electrode 129 and the channel layer 122 and between the drain electrode 130 and the channel layer 122. However, the contact layers are not essential. For example, the source and drain electrodes may be formed on the channel layer 122, and the contact region between the channel layer 122 and the electrode may be heavily doped with impurity.

What is claimed is:

1. A method of manufacturing a semiconductor device functioning as an FET and formed at a portion of a compound semiconductor substrate comprising the steps of:

forming an active layer of a first conductivity type at a portion of said compound semiconductor substrate, said active layer having a carrier concentration required for operation of said FET and forming a channel region of said FET;

forming a first insulating film on said active layer;

forming a partial hole by removing an upper portion of said first insulating film so as to provide an opening for formation of a gate electrode, simultaneously with the formation of a low carrier concentration layer at a portion of said active layer, which is located beneath said partial hole by damaging said portion of said active layer by means of implantation of etching-ions into said portion of said active layer through the remaining portion of said first insulating film which is left unetched at the bottom of said partial hole, said partial hole being formed via an etching process;

forming a through hole by removing said remaining portion of said first insulating film at the bottom of said partial hole without damaging said active layer;

forming a gate electrode of said FET at a portion of said active layer in a self-alignment manner by depositing a conductive film within said through hole; and forming source/drain regions of said FET connected to said active layer by introducing impurity into portions of said compound semiconductor substrate at opposite sides of said gate electrode;

said formation of said low carrier concentration layer comprising an etching process for removing an upper layer portion of said first insulating so as to form an opening for said gate electrode, said etching process simultaneously reducing said carrier at said portion of the surface region of said active layer.

2. The method of manufacturing the semiconductor device according to claim 1, wherein said method further comprises the step of depositing on said compound semiconductor substrate a film having a function of reducing by a predetermined rate an implantation energy of said impurity ions prior to said step of forming said active layer, and the impurity ions are implanted into said compound semiconductor substrate through said film in said step of forming said active layer.

3. The method of manufacturing the semiconductor device according to claim 2, wherein a metal film for forming the gate electrode of said FET is deposited as said film in said step of depositing said film.

4. The method of manufacturing the semiconductor device according to claim 1, wherein said step of forming said low carrier concentration layer includes the steps of:

depositing a second insulating film on said first insulating film;

forming a first resist mask located on said second insulating film and having an opening located at a region including at least a gate electrode formation region;

removing said second insulating film and an upper layer portion of said first insulating film at said gate electrode formation region by effecting dry-etching on said second insulating film using said first resist mask and etching agent allowing etching of said second insulating film at an etching rate larger than that of said first insulating film;

forming a second resist mask having an opening located at a region including at least said gate electrode formation region; and removing a lower layer portion of said first insulating film at the gate electrode formation region by effecting etching on said first insulating film with said second resist mask;

said dry-etching effected on said second insulating film forms the low carrier concentration layer made of a damage layer at a surface region of said active layer located at the opening of said first resist mask.

5. The method of manufacturing the semiconductor device according to claim 4, wherein said method further comprises, between said step of forming said first insulating film and said step of forming the second insulating film, the step of annealing said active layer for activating said active layer using said first insulating film as a protection film, and said first insulating film is used as a protection film of the FET formed on said compound semiconductor substrate.

6. The method of manufacturing the semiconductor device according to claim 4, wherein said overetching at said step of removing said upper layer portion of said first insulating film and said second insulating layer is dry etching, and said etching at said step of removing said lower layer portion of said first insulating film is wet etching.

7. The method of manufacturing the semiconductor device according to claim 4, wherein said first insulating film is a silicon oxide film, and said second insulating film is a silicon nitride film.

8. The method of manufacturing the semiconductor device according to claim 1, wherein ions are selectively implanted into a predetermined portion on said compound semiconductor substrate at said step of forming the active layer, and said step of forming said low carrier concentration layer includes the steps of:

forming a first resist film having an opening at a region including at least a gate electrode formation region on said first insulating film; and removing said upper layer portion of said first insulating film at said gate electrode formation region by effecting dry etching on said first insulating film using said first resist mask to an extent reducing a carrier concentration near the surface of said active layer;

forming a second resist mask having an opening located at a region including at least said gate formation region; and removing a lower layer portion of said first insulating film at said gate electrode formation region by effecting wet etching on said first insulating film using said second resist mask.

9. The method of manufacturing the semiconductor device according to claim 4, wherein said step of forming said first resist mask is carried out such that said opening at said first resist mask is wider than said gate electrode formation region, and said step of forming said second resist mask is carried out such that said second resist mask has the opening at a region offset toward said source region.

10. The method of manufacturing the semiconductor device according to claim 9, wherein said step of forming said second resist mask is carried out such that said second resist mask has the opening at a region offset toward the source to include an end near said source region of said opening formed at said step of removing said second insulating film and the upper layer portion of said first insulating film, and said step of forming said gate electrode is carried out such that a metal film forming said gate electrode is deposited from an upper side of said second resist mask, and subsequently said second resist mask is lifted off while leaving said gate electrode.

11. The method of manufacturing the semiconductor device according to claim 9, wherein said method further comprises the step, after said step of forming said gate electrode, of effecting dry etching to reduce further the carrier concentration at the surface region of said active region except for said damage region while leaving a lower portion of the lower layer portion of said first insulating film, and thereby forming a second damage layer.

* * * * *